United States Patent
Kim et al.

(10) Patent No.: US 12,176,919 B2
(45) Date of Patent: Dec. 24, 2024

(54) ERROR CORRECTION CODE CIRCUIT, MEMORY DEVICE INCLUDING ERROR CORRECTION CODE CIRCUIT, AND OPERATION METHOD OF ERROR CORRECTION CODE CIRCUIT

(71) Applicant: SAMSUNG ELECTRONICS CO., LTD., Suwon-si (KR)

(72) Inventors: Sung-Rae Kim, Hwaseong-si (KR); Kijun Lee, Seoul (KR); Myungkyu Lee, Seoul (KR); Sunghye Cho, Hwaseong-si (KR); Jin-Hoon Jang, Uiwang-si (KR); Isak Hwang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 49 days.

(21) Appl. No.: 17/988,140

(22) Filed: Nov. 16, 2022

(65) Prior Publication Data

US 2023/0163786 A1   May 25, 2023

(30) Foreign Application Priority Data

Nov. 25, 2021 (KR) .................. 10-2021-0164956
Apr. 21, 2022 (KR) .................. 10-2022-0049463

(51) Int. Cl.
*H03M 13/00* (2006.01)
*G11C 29/00* (2006.01)
*H03M 13/09* (2006.01)
*H03M 13/11* (2006.01)
*H03M 13/15* (2006.01)

(52) U.S. Cl.
CPC ..... *H03M 13/1174* (2013.01); *H03M 13/098* (2013.01); *H03M 13/1575* (2013.01)

(58) Field of Classification Search
CPC .......... H03M 13/1174; H03M 13/098; H03M 13/1575
See application file for complete search history.

(56) References Cited

U.S. PATENT DOCUMENTS

| | | | |
|---|---|---|---|
| 8,640,005 B2 | 1/2014 | Wilkerson et al. | |
| 10,162,703 B2 * | 12/2018 | Kim | H03M 13/1575 |
| 10,802,912 B2 | 10/2020 | Cha et al. | |
| 11,036,578 B2 | 6/2021 | Kim et al. | |
| 11,088,710 B2 | 8/2021 | Lee et al. | |
| 2018/0343018 A1 * | 11/2018 | Chen | H03M 13/07 |

(Continued)

*Primary Examiner* — Christine T. Tu
(74) *Attorney, Agent, or Firm* — Muir Patent Law, PLLC

(57) ABSTRACT

Disclosed is a memory device which includes a memory cell array that stores first data and first parity data, an error correction code (ECC) circuit that performs ECC decoding based on the first data and the first parity data and outputs error-corrected data and a decoding status flag, and an input/output circuit that provides the error-corrected data and the decoding status flag to a memory controller. The ECC circuit includes a syndrome generator that generates a syndrome based on the first data and the first parity data, a syndrome decoding circuit that decodes the syndrome to generate an error vector, a correction logic circuit that generates the error-corrected data based on the error vector and the first data, and a fast decoding status flag (DSF) generator that generates the decoding status flag based on the syndrome, without the error vector.

20 Claims, 29 Drawing Sheets

(56) References Cited

U.S. PATENT DOCUMENTS

| | | |
|---|---|---|
| 2019/0042358 A1 | 2/2019 | Criss et al. |
| 2019/0356331 A1* | 11/2019 | Kim .................. H03M 13/3746 |
| 2020/0210287 A1 | 7/2020 | Jalan et al. |
| 2021/0004289 A1 | 1/2021 | Lee et al. |
| 2021/0191813 A1 | 6/2021 | Lu |
| 2021/0193245 A1 | 6/2021 | Ryu et al. |
| 2022/0190846 A1* | 6/2022 | Imel .................. H03M 13/1174 |

* cited by examiner

| SYD | | Order | 7 | 6 | 5 | 4 | 3 | 2 | 1 | 0 |
|---|---|---|---|---|---|---|---|---|---|---|
| | | Bit Position | 0 | 1 | 2 | 3 | 4 | 5 | 6 | 7 |
| S0 | 1st sub-Rows | | 1 | 0 | 0 | 0 | 0 | 0 | 0 | 0 |
| S1 | | | 0 | 1 | 0 | 0 | 0 | 0 | 0 | 0 |
| S2 | | | 0 | 0 | 1 | 0 | 0 | 0 | 0 | 0 |
| S3 | 2nd sub-Rows | | 0 | 0 | 0 | 1 | 0 | 0 | 0 | 0 |
| S4 | | | 0 | 0 | 0 | 0 | 1 | 0 | 0 | 0 |
| S5 | | | 0 | 0 | 0 | 0 | 0 | 1 | 0 | 0 |
| S6 | | | 0 | 0 | 0 | 0 | 0 | 0 | 1 | 0 |
| S7 | | | 0 | 0 | 0 | 0 | 0 | 0 | 0 | 1 |

ERROR CORRECTION CODE CIRCUIT, MEMORY DEVICE INCLUDING ERROR CORRECTION CODE CIRCUIT, AND OPERATION METHOD OF ERROR CORRECTION CODE CIRCUIT

CROSS-REFERENCE TO RELATED APPLICATIONS

This application claims priority under 35 U.S.C. § 119 to Korean Patent Application Nos. 10-2021-0164956 filed on Nov. 25, 2021, and 10-2022-0049463 filed on Apr. 21, 2022, in the Korean Intellectual Property Office, the disclosures of which are incorporated by reference herein in their entireties.

BACKGROUND

1. Field

Embodiments relate to a semiconductor memory, and more particularly, relate to an error correction code circuit, a memory device including the same, and an error correction code decoding method of the memory device.

2. Description of the Related Art

A semiconductor memory device may be classified as a volatile memory device, in which stored data disappear when a power supply is turned off, such as a static random access memory (SRAM) or a dynamic random access memory (DRAM), or a nonvolatile memory device, in which stored data are retained even when a power supply is turned off, such as a flash memory device, a phase-change RAM (PRAM), a magnetic RAM (MRAM), a resistive RAM (RRAM), or a ferroelectric RAM (FRAM).

SUMMARY

An embodiment is directed to a memory device that includes a memory cell array that stores first data and first parity data, an error correction code (ECC) circuit that performs ECC decoding based on the first data and the first parity data and outputs error-corrected data and a decoding status flag, and an input/output circuit that provides the error-corrected data and the decoding status flag to a memory controller. The ECC circuit includes a syndrome generator that generates a syndrome based on the first data and the first parity data, a syndrome decoding circuit that decodes the syndrome to generate an error vector, a correction logic circuit that generates the error-corrected data based on the error vector and the first data, and a fast decoding status flag (DSF) generator that generates the decoding status flag based on the syndrome, without the error vector.

An embodiment is directed to an error correction code (ECC) circuit configured to correct first data based on the first data and first parity data stored in a memory device that includes a syndrome generator that generates a syndrome based on the first data and the first parity data from the memory device, a syndrome decoding circuit that compares the syndrome and each column of a parity-check matrix to generate an error vector, a correction logic circuit that generates error-corrected data based on the error vector and the first data, and a fast decoding status flag (DSF) generator that generates a decoding status flag indicating a decoding status for the error-corrected data based on the syndrome and a simplified-parity-check matrix, and the simplified-parity-check matrix includes only information about a part of the parity-check matrix.

An embodiment is directed to an operation method of an error correction code (ECC) circuit configured to correct first data based on the first data and first parity data stored in a memory device that includes generating a syndrome based on the first data and the first parity data, generating an error vector based on the syndrome and a parity-check matrix, performing a logical operation on the error vector and the first data to generate error-corrected data, generating a decoding status flag based on the syndrome and a simplified-parity-check matrix, and sending the error-corrected data and the decoding status flag to a memory controller, and the generating of the error vector and the generating of the decoding status flag are performed in parallel.

An embodiment is directed to a method of configuring an error correction code (ECC) circuit that includes determining a parity-check matrix to be used for syndrome decoding of the ECC circuit, generating a simplified-parity-check matrix based on a repetitive characteristic of the parity-check matrix, and configuring a fast decoding status flag generator of the ECC circuit such that a logical operation is performed on information about a part of the syndrome based on information about each column of the simplified-parity-check matrix, and the simplified-parity-check matrix includes only information about a part of the parity-check matrix.

BRIEF DESCRIPTION OF THE FIGURES

Features will become apparent to those of skill in the art by describing in detail example embodiments with reference to the attached drawings in which:

FIGS. 6, 7A, 7B, and 7C are diagrams illustrating some examples of an H-matrix used by a syndrome decoding circuit of FIG. 5A.

FIG. 14 is a diagram illustrating an example of a simplified H-matrix according to an example embodiment.

DETAILED DESCRIPTION

Figure 1:
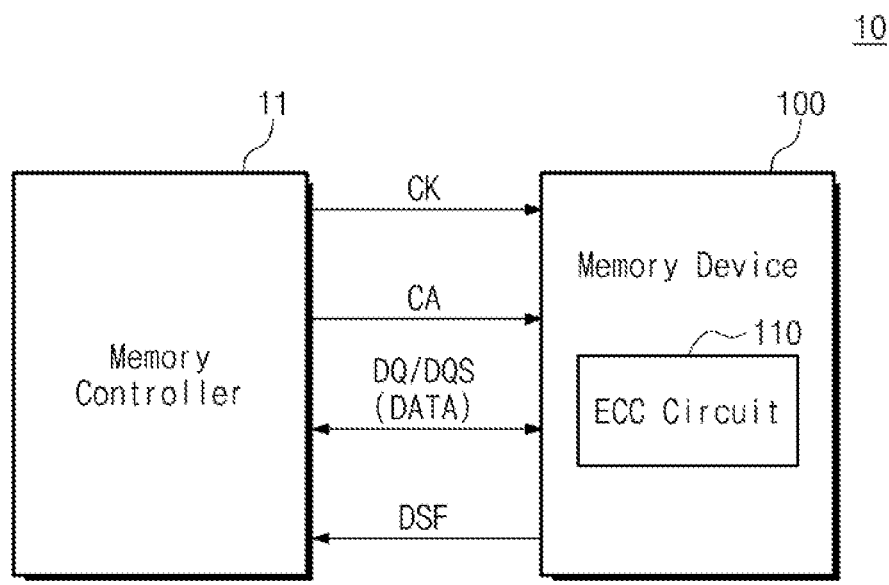
FIG. 1 is a block diagram illustrating a memory system according to an example embodiment.

FIG. 1 is a block diagram illustrating a memory system according to an example embodiment.

Referring to FIG. 1, a memory system 10 may include a memory controller 11 and a memory device 100. The memory system 10 may be one of information processing devices, which are configured to process a variety of information and to store the processed information, such as a personal computer (PC), a laptop, a server, a workstation, a smartphone, a tablet PC, a digital camera, and a black box.

The memory controller 11 may store data in the memory device 100 or may read data stored in the memory device 100. For example, the memory controller 11 may send a clock signal CK and a command/address signal CA to the memory device 100, and may exchange a data signal DQ and a data strobe signal DQS with the memory device 100. Through the data signal DQ and the data strobe signal DQS, data "DATA" may be sent from the memory controller 11 to the memory device 100 or may be sent from the memory device 100 to the memory controller 11. The memory controller 11 and the memory device 100 may communicate with each other based on the DDR interface or the LPDDR interface.

The memory device 100 may operate under control of the memory controller 11. The memory device 100 may be a dynamic random access memory (DRAM). The memory device 100 may include a volatile memory such as an SRAM or a nonvolatile memory such as a PRAM and/or an RRAM.

The memory device 100 may include an error correction code (ECC) circuit 110. The ECC circuit 110 may be configured to detect and correct an error of data that are present in the memory device 100. The ECC circuit 110 may generate parity data by performing ECC decoding on first data received from the memory controller 11. The memory device 100 may store the first data received from the memory controller 11 together with the parity data generated by the ECC circuit 110. During an operation of the memory device 100, an error may occur in the first data present in the memory device 100 due to various factors. When a read request for the first data is made by the memory controller 11, the ECC circuit 110 may correct an error of the first data by performing ECC decoding based on the first data and the corresponding parity data. The memory device 100 may send the corrected first data to the memory controller 11.

The ECC circuit 110 may correct an error within the given error correction capability. When an error detected from data exceeds the error correction capability of the ECC circuit 110, the error detected from the data may not be corrected normally.

The memory controller 11 requires information for determining whether read data received from the memory device 100 include an uncorrectable error or are normal data (e.g., error-free data or data in which an error is normally corrected). Thus, the ECC circuit 110 may send a decoding status flag DSF to the memory controller 11. The decoding status flag DSF refers to information indicating whether data sent to the memory controller 11 are UE data or normal data. The decoding status flag DSF may be generated in the ECC decoding process of the ECC circuit 110.

According to an example embodiment, the ECC circuit 110 may generate the decoding status flag DSF using only a syndrome that is generated in the ECC decoding process. In this case, a time taken to generate the decoding status flag DSF may be shortened. A configuration of the ECC circuit 110 and a way to generate the decoding status flag DSF will be described in detail below.

Figure 2:
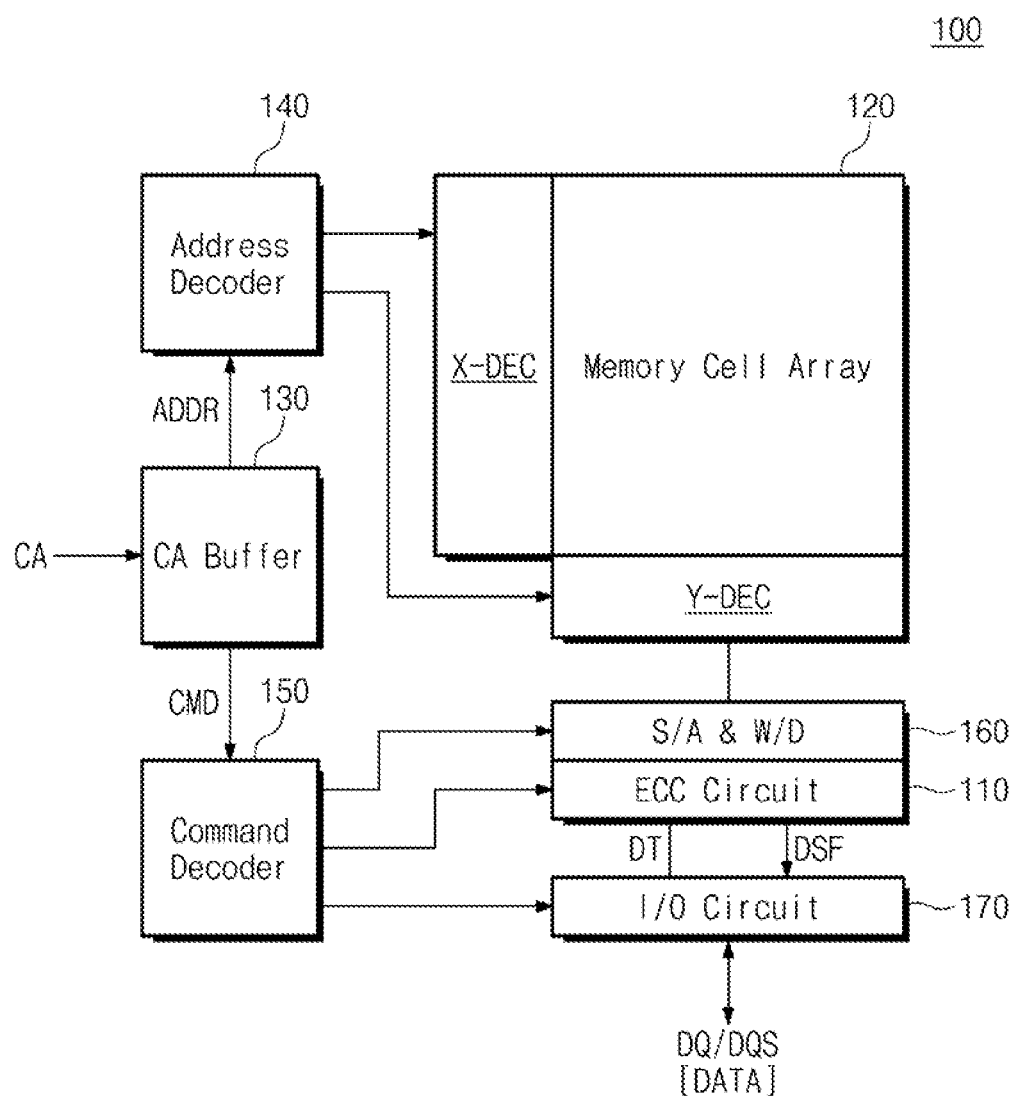
FIG. 2 is a block diagram illustrating a memory device of FIG. 1.

FIG. 2 is a block diagram illustrating a memory device of FIG. 1.

Referring to FIGS. 1 and 2, the memory device 100 may include the ECC circuit 110, a memory cell array 120, a CA buffer 130, an address decoder 140, a command decoder 150, a sense amplifier and write driver 160, and an input/output circuit 170.

The ECC circuit 110 may generate parity data by performing ECC encoding on data to be stored in the memory cell array 120. In another implementation, the ECC circuit 110 may correct an error of data read from the memory cell array 120 by performing ECC decoding based on the read data and parity data. A configuration and an operation of the ECC circuit 110 will be described in detail below.

The memory cell array 120 may include a plurality of memory cells. The plurality of memory cells may be connected with a plurality of word lines and a plurality of bit lines. The plurality of word lines may be driven by an X-decoder (or row decoder) X-DEC, and the plurality of bit lines may be driven by a Y-decoder (or column decoder) Y-DEC.

The CA buffer 130 may be configured to receive command/address signals CA, and to temporarily store or buffer the received signals.

The address decoder 140 may decode address signals ADDR stored in the CA buffer 130. The address decoder 140 may control the X-decoder and the Y-decoder based on a decoding result.

The command decoder 150 may decode a command CMD stored in the CA buffer 130. The command decoder 150 may control the components of the memory device 100 based on a decoding result.

For example, in the case where the command signal stored in the CA buffer 130 corresponds to a write command (i.e., in the case where a command received from the memory controller 11 is the write command), the command decoder 150 may control the ECC circuit 110 such that the data "DATA" received through the input/output circuit 170 are written in the memory cell array 120 (i.e., may perform ECC encoding), and may control an operation of the sense amplifier and write driver 160 (i.e., may activate the write driver).

As another example, in the case where the command signal stored in the CA buffer 130 corresponds to a read command (i.e., in the case where the command received from the memory controller 11 is the read command), the command decoder 150 may control the ECC circuit 110 such that data stored in the memory cell array 120 are read out (i.e., may perform ECC decoding), and may control an operation of the sense amplifier and write driver 160 (i.e., may activate the sense amplifier).

Under control of the command decoder 150, the sense amplifier and write driver 160 may read data stored in the memory cell array 120 through the plurality of bit lines or may write data in the memory cell array 120 through the plurality of bit lines.

Based on the data signal DQ and the data strobe signal DQS, the input/output circuit 170 may receive the data "DATA" from the memory controller 11 or may send the data "DATA" to the memory controller 11. The input/output circuit 170 may receive the decoding status flag DSF from the ECC circuit 110, and may send the decoding status flag DSF to the memory controller 11. The decoding status flag DSF may be sent to the memory controller 11 through the data signal DQ. In another implementation, the decoding status flag DSF may be sent to the memory controller 11 through various control signals (e.g., DBI and DMI) or any other dedicated signal.

Figure 3:
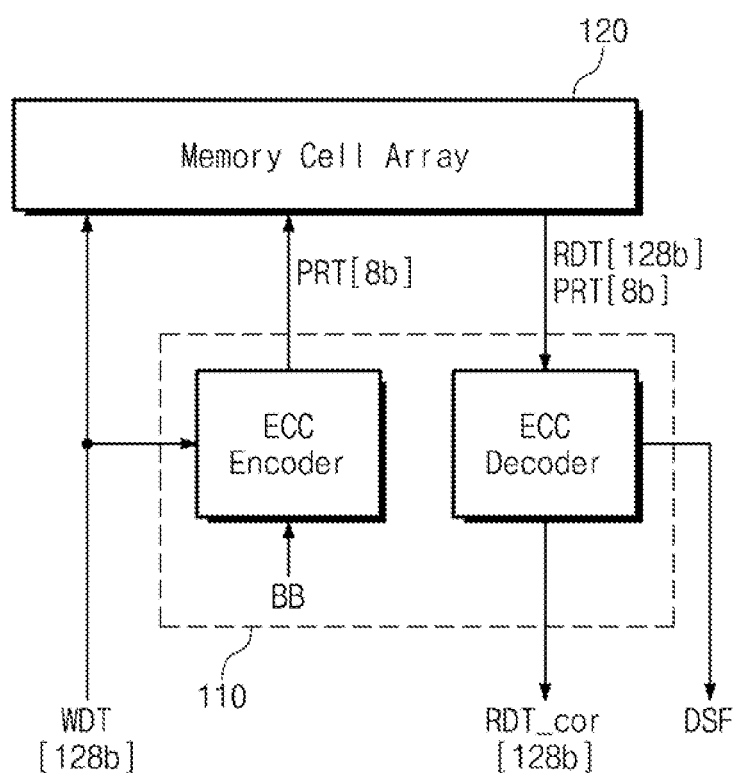
FIG. 3 is a block diagram for describing an operation of an error correction code (ECC) circuit of FIG. 2.

FIG. 3 is a block diagram for describing an operation of an ECC circuit of FIG. 2.

For brevity of drawing and for convenience of description, components that are unnecessary to describe an operation of the ECC circuit 110 are omitted.

Referring to FIGS. 2 and 3, the ECC circuit 110 may include an ECC encoder and an ECC decoder. The ECC encoder may generate parity data PRT by performing ECC encoding on write data WDT to be stored in the memory array 120. For example, with regard to the write data WDT having 128b (i.e., 128 bits), the ECC encoder may generate the parity data PRT having 8b (i.e., 8 bits) using a basis bit BB having 8b. The write data WDT and the parity data PRT may be stored in the memory cell array 120 through the sense amplifier and write driver 160.

The ECC decoder may output error-corrected read data RDT_cor by performing ECC decoding based on read data RDT and the parity data PRT read from the memory cell array 120. For example, with regard to the write data RDT having 128b, the ECC decoder may generate the error-corrected read data RDT_cor having 128b using the parity data PRT having 8b. The ECC decoder may generate the decoding status flag DSF indicating an ECC decoding result or a status of the error-corrected read data RDT_cor.

Below, descriptions may be given as some data values or bit values are at a specific level or a specific bit level (e.g., "1" or "0"). However, it will be understood that various data values or bit values that are described by way of example may be variously modified or changed.

Figure 4A:
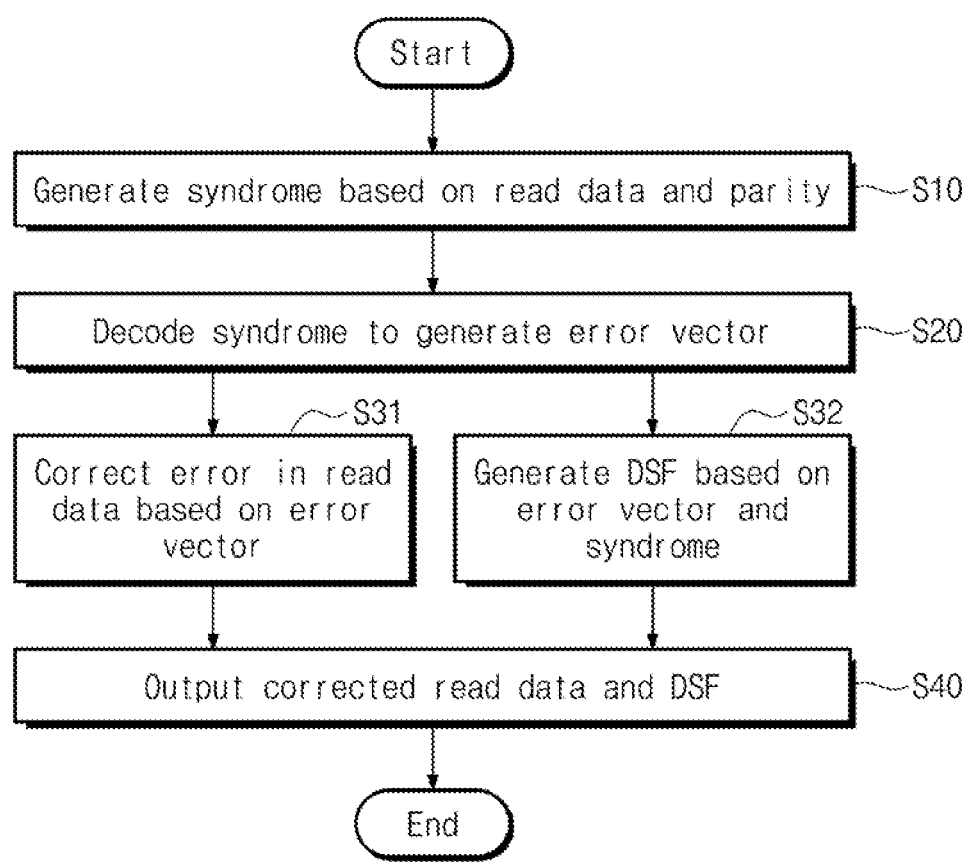
FIG. 4A is a flowchart illustrating a reference example of an operation of an ECC decoder.
Figure 4B:
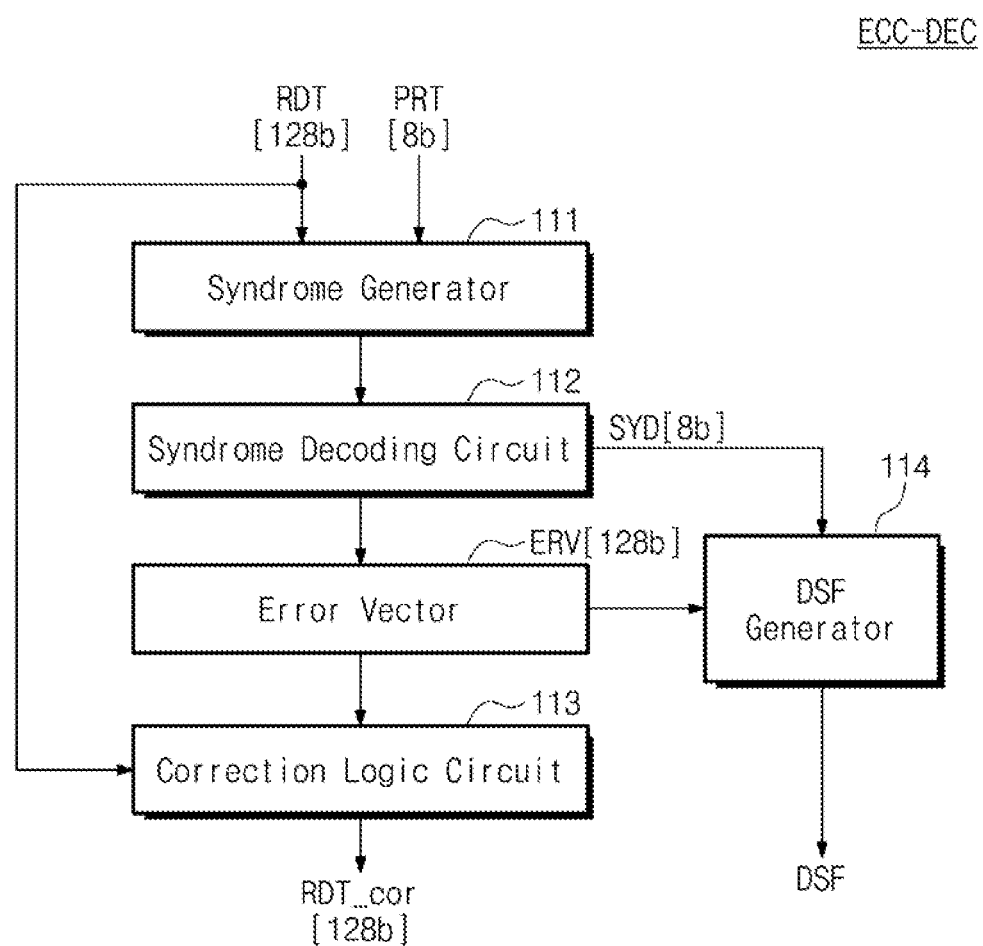
FIG. 4B is a block diagram illustrating an ECC decoder configured to perform an operation according to the flowchart of FIG. 4A.
Figure 4C:
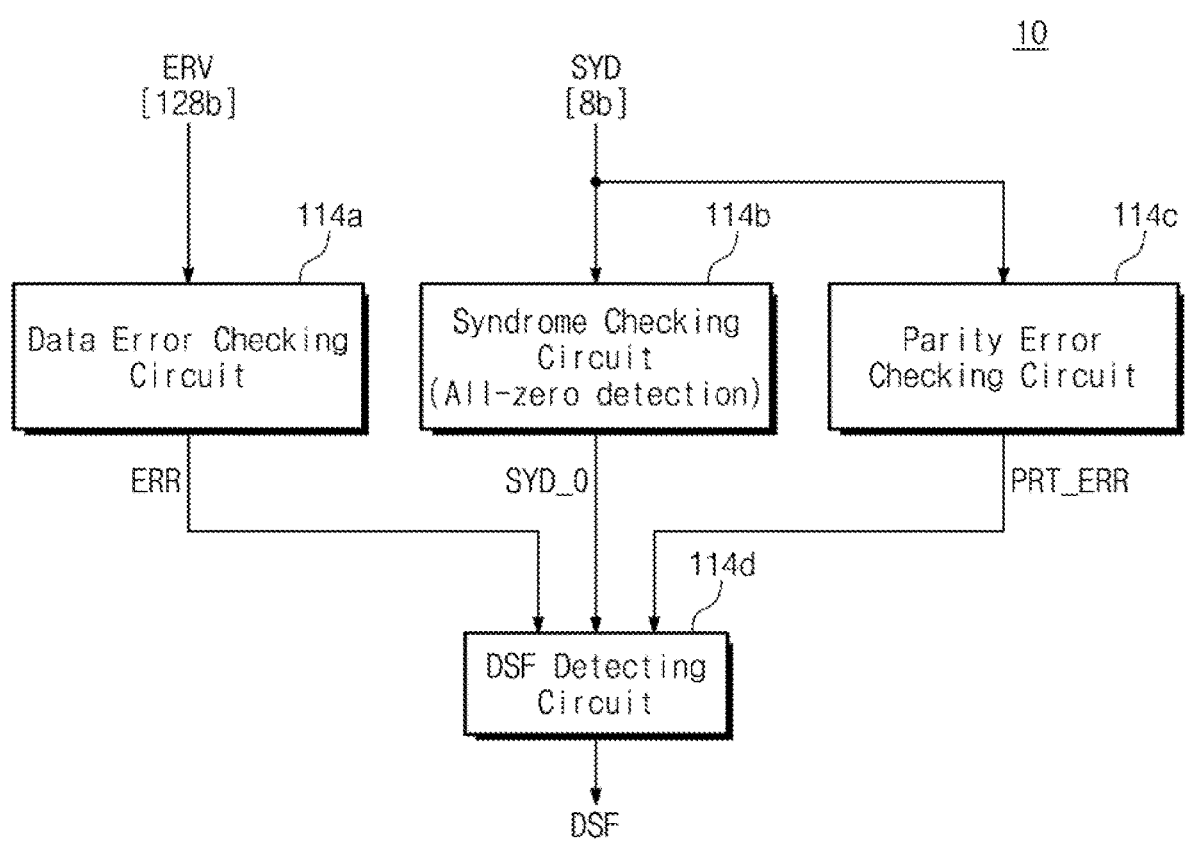
FIG. 4C is a block diagram illustrating a DSF generator of FIG. 4B.

FIG. 4A is a flowchart illustrating a reference example of an operation of an ECC decoder. FIG. 4B is a block diagram illustrating an ECC decoder configured to perform an operation according to the flowchart of FIG. 4A. FIG. 4C is a block diagram illustrating a DSF generator of FIG. 4B.

In the reference example, referring to FIGS. 4A, 4B, and 4C, in operation S10, the ECC decoder ECC-DEC may generate a syndrome SYD based on the read data RDT and the parity data PRT. For example, in the read operation of the memory device 100, the sense amplifier and write driver 160 may read the read data RDT and the parity data PRT stored in the memory cell array 120, and may transfer the read data RDT and the parity data PRT to the ECC decoder ECC-DEC. Referring to FIG. 4B, the ECC decoder ECC-DEC may include a syndrome generator 111. The syndrome generator 111 may generate the syndrome SYD based on the read data RDT having 128b and the parity data PRT having 8b. The syndrome generator 111 may generate a check bit having 8b based on the read data RDT having 128b, and may generate the syndrome SYD having 8b by performing a logical operation on the check bit having 8b and the parity data PRT having 8b.

In operation S20, the ECC decoder ECC-DEC may generate an error vector ERV by performing decoding on the syndrome SYD. For example, referring to FIG. 4B, the ECC decoder ECC-DEC may further include a syndrome decoding circuit 112. The syndrome decoding circuit 112 may receive the syndrome SYD from the syndrome generator 111, and may generate the error vector ERV by decoding the received syndrome SYD.

The syndrome decoding circuit 112 may detect a position of the read data RDT, at which an error occurs, by comparing a parity-check matrix (hereinafter referred to as an "H-matrix") and the syndrome SYD. The error vector ERV may have a size having 128b (which may be equal in size to the read data RDT), and may include information about the position of the read data RDT, at which the error occurs.

In operation S31, the ECC decoder ECC-DEC may correct an error of the read data RDT using the error vector ERV. For example, referring to FIG. 4B, the ECC decoder ECC-DEC may further include a correction logic circuit 113. The correction logic circuit 113 may output error-corrected read data RDT_cor by performing a bitwise XOR operation on the error vector ERV and the read data RDT read by the sense amplifier and write driver 160.

In operation S32, the ECC decoder ECC-DEC may generate the decoding status flag DSF based on the error vector ERV and the syndrome SYD. For example, referring to FIG. 4B, the ECC decoder ECC-DEC may further include a DSF generator 114. The DSF generator 114 may receive the syndrome SYD having 8b from the syndrome decoding circuit 112 and the error vector ERV having 128b, and may generate the decoding status flag DSF based on the received information.

In detail, referring to FIG. 4C, the DSF generator 114 may include a data error checking circuit 114a, a syndrome checking circuit 114b, a parity error checking circuit 114c, and a decoding status flag detecting circuit 114d.

The data error checking circuit 114a may generate error information ERR indicating whether an error is included in the read data RDT, based on the error vector ERV. The data error checking circuit 114a may generate the error information ERR by determining whether at least one of bits of the error vector ERV is "1". In an implementation, a value of the error information ERR of "0" may indicate that an error is absent from the read data RDT; and a value of the error information ERR of "1" may indicate that an error is present in the read data RDT.

The syndrome checking circuit 114b may generate syndrome information SYD_0, based on that all the bits of the syndrome SYD are "0". The case where all the bits of the syndrome SYD are "0" (i.e., the case where the syndrome SYD is all-zero) may indicate that an error is absent from the read data RDT and the parity data PRT; the case where at least one of the bits of the syndrome SYD are "1" (i.e., the case where the syndrome SYD is non-zero) may indicate that an error is present in the read data RDT or the parity data PRT. In an implementation, the syndrome information SYD_0 may be "1" when all the bits of the syndrome SYD are "0" (i.e., when the syndrome SYD is all-zero), and may be "0" when at least one of the bits of the syndrome SYD is "1" (i.e., when the syndrome SYD is non-zero).

The parity error checking circuit 114c may output parity error information PRT_ERR based on that an error is present in the parity data PRT. The parity error checking circuit 114c may generate the parity error information PRT_ERR based on an n×n identity matrix and the syndrome SYD (n indicating a size (i.e., the number of bits) of the syndrome SYD).

The decoding status flag detecting circuit 114d may generate the decoding status flag DSF based on the error information ERR, the syndrome information SYD_0, and the parity error information PRT_ERR. For example, the decoding status flag DSF may indicate a decoding status for the ECC decoding result. The decoding status may indicate whether final data (i.e., the error-corrected read data RDT_cor) output by the ECC decoder ECC-DEC are normal data (i.e., whether an error is absent from the read data RDT or whether a correctable error is included in the read data RDT) or whether an uncorrectable error is included in the read data RDT.

Below, for convenience of description, a decoding result or a decoding status corresponding to the case where an uncorrectable error is included in the read data RDT is called an uncorrectable error (UE); a decoding result or a decoding status corresponding to the case where a correctable error is included in the read data RDT is called a correctable error (CE); a decoding result or a decoding status corresponding to the case where an error is not included in the read data RDT is called a non-error (NE).

In an example, when the error information ERR is "0" (i.e., an error is absent from the read data RDT), the syndrome information SYD_0 is "0" (i.e., an error is present in the read data RDT or the parity data PRT), and the parity error information PRT_ERR is "0" (i.e., an error is absent from the parity data PRT), the decoding status may be the "UE". In this case, the decoding status flag DSF may be set to "1".

As another example, in an information combination different from the above case, the error-corrected read data RDT_cor output from the ECC decoder ECC-DEC may be in a state of normal data (i.e., in a state where there is no error or an error is normally corrected). In this case (i.e., in the case of the "NE" or "CE"), the decoding status flag DSF may be set to "0".

Returning to FIG. 4A, in operation S40, the ECC decoder ECC-DEC may output the error-corrected read data RDT_cor and the decoding status flag DSF. The error-corrected read data RDT_cor and the decoding status flag DSF may be provided to the memory controller 11 through the input/output circuit 170 (refer to FIG. 2). The memory controller 11 may determine a decoding status of the received data based on the decoding status flag DSF and may perform various operations based on a determination result. For example, with regard to the "UE", the memory controller 11 may perform a read retry operation, a reset operation, or various other maintenance operations.

The operation of the ECC decoder ECC-DEC described with reference to FIGS. 4A to 4C may be implemented through various logical operation circuits. For example, operation S10 (i.e., the syndrome generating operation) may be performed through a 6-stage XOR operation circuit, operation S20 (i.e., the syndrome decoding operation) may be performed through a 3-stage AND operation circuit, and operation S31 (i.e., the error correction operation) may be performed through a 1-stage XOR operation circuit.

With regard to operation S32 (i.e., the operation of generating the decoding status flag DSF), the data error checking circuit 114a may be implemented through a 7-stage XOR operation circuit, the syndrome checking circuit 114b may be implemented through a 4-stage AND operation circuit, the parity error checking circuit 114c may be implemented through a 3-stage AND operation circuit and a 3-stage OR operation circuit, and the decoding status flag detecting circuit 114d may be implemented through a 1-stage OR operation circuit, a 1-stage invert (INV) operation circuit, and a 1-stage AND operation circuit.

As described above in the reference example of FIGS. 4A-4C, the error vector ERV is used in operation S32. Thus, operation S32 is performed after operation S20 is completed. In this case, a latency from a time point when the syndrome decoding operation is completed to a time point when operation S32 is completed may be a latency corresponding to a total of 7 OR operation circuit stages, one INV operation circuit stage, and one AND operation circuit stage.

Also, operation S32 is performed in parallel with operation S31. In this case, because the latency for operation S32 is relatively long compared to the latency for operation S31, it will be understood that operation S32 (i.e., the operation of generating the decoding status flag DSF) may cause a reduction of performance.

On the other hand, as will now be described with reference to FIGS. 5A to 5C, a latency in generating the decoding status flag DSF according to an example embodiment may be decreased.

Figure 5A:
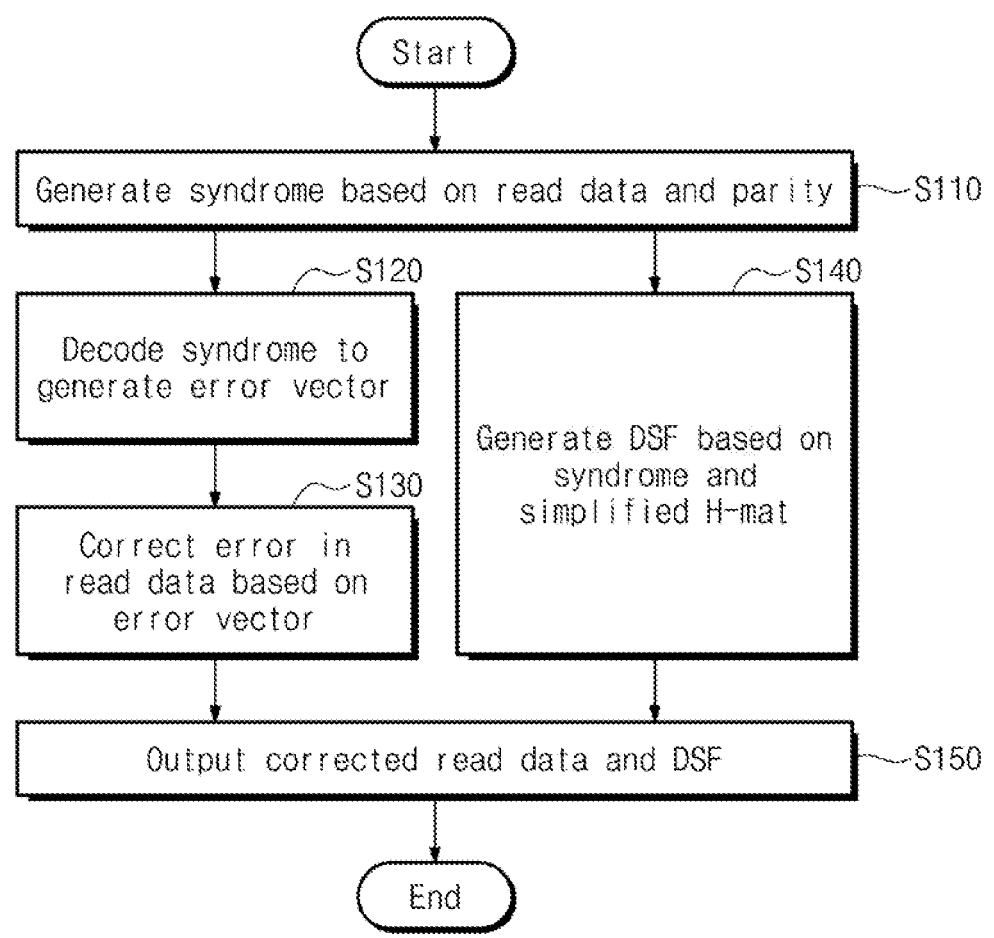
FIG. 5A is a flowchart illustrating an operation of an ECC decoder of FIG. 3 according to an example embodiment.

FIG. 5A is a flowchart illustrating an operation of an ECC decoder of FIG. 3 according to an example embodiment. FIG. 5B is a block diagram illustrating an ECC decoder configured to perform an operation according to the flowchart of FIG. 5A. FIG. 5C is a block diagram illustrating a fast DSF generator of FIG. 5B. Below, for convenience of description, additional description associated with the components described above will be omitted to avoid redundancy.

In the present example embodiment, referring to FIGS. 3, 5A, 5B, and 5C, in operation S110, an ECC decoder ECC-DEC-1 may generate the syndrome SYD based on the read data RDT and the parity data PRT. For example, referring to FIG. 5B, the ECC decoder ECC-DEC-1 may include the syndrome generator 111. Operation S110 of FIG. 5A is similar to operation S10 of FIG. 4A, and an operation of the syndrome generator 111 of FIG. 5B may be similar to the operation of the syndrome generator 111 of FIG. 4B.

In operation S120, the ECC decoder ECC-DEC-1 may generate the error vector ERV by performing decoding on the syndrome SYD. For example, referring to FIG. 5B, the ECC decoder ECC-DEC-1 may include the syndrome decoding circuit 112. Operation S120 of FIG. 5A is similar to operation S20 of FIG. 4A, and an operation of the syndrome decoding circuit 112 of FIG. 5B may be similar to the operation of the syndrome decoding circuit 112 of FIG. 4B.

In operation S130, the ECC decoder ECC-DEC-1 may correct an error of the read data RDT based on the error vector ERV. For example, referring to FIG. 5B, the ECC decoder ECC-DEC-1 may include the correction logic circuit 113. Operation S130 of FIG. 5A is similar to operation S31 of FIG. 4A, and an operation of the correction logic circuit 113 of FIG. 5B may be similar to the operation of the correction logic circuit 113 of FIG. 4B.

In operation S140, the ECC decoder ECC-DEC-1 may generate the decoding status flag DSF based on a syndrome and a simplified H-matrix. As compared to the ECC decoder ECC_DEC of the reference example in FIG. 4B, the ECC decoder ECC-DEC-1 of the present example embodiment may further include a fast DSF generator 115, as shown in FIG. 5B. This is further described below.

Referring again to FIG. 5A, in operation S150, the ECC decoder ECC-DEC-1 may output the error-corrected read data RDT_cor and the decoding status flag DSF. Operation S150 of FIG. 5A may be similar to operation S40 of FIG. 4A.

Figure 5B:
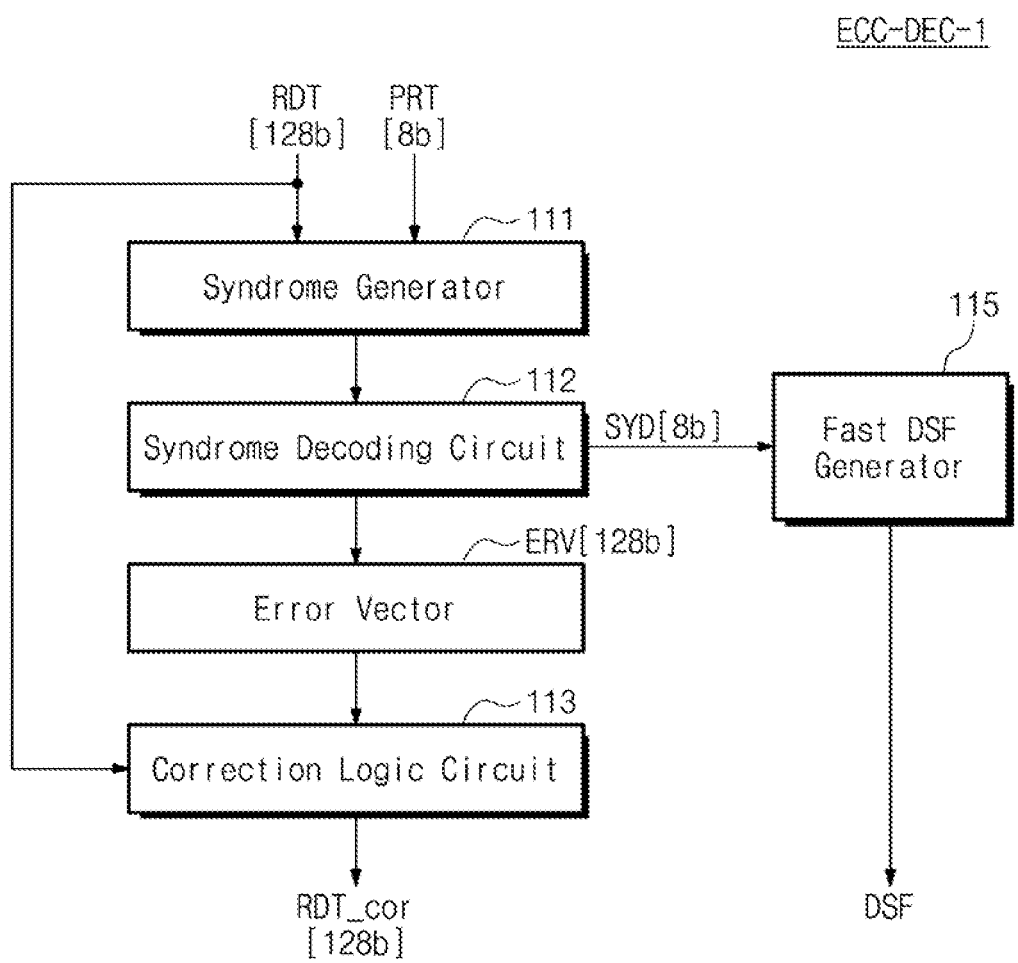
FIG. 5B is a block diagram illustrating an ECC decoder configured to perform an operation according to the flowchart of FIG. 5A.
Figure 5C:
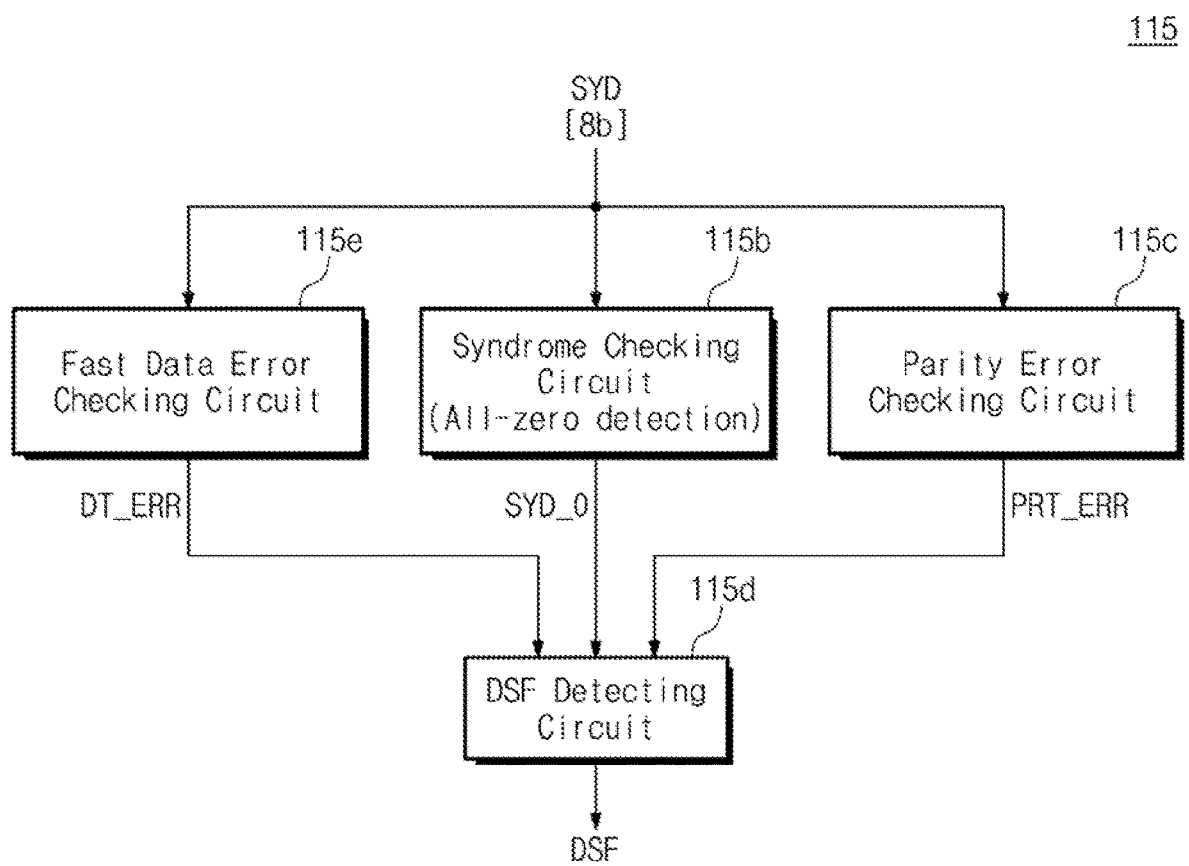
FIG. 5C is a block diagram illustrating a fast DSF generator of FIG. 5B.

In the present example embodiment, referring to FIGS. 5A to 5C, the fast DSF generator 115 may generate the decoding status flag DSF using only the syndrome SYD without the error vector ERV. Because the fast DSF generator 115 does not use the error vector ERV for the purpose of generating the decoding status flag DSF, the fast DSF generator 115 may operate in parallel with the syndrome decoding operation (e.g., operation S120) or at the same time with the syndrome decoding operation (e.g., operation S120).

For example, referring to FIG. 5B, the ECC decoder ECC-DEC-1 may include the fast DSF generator 115. The fast DSF generator 115 may receive the syndrome SYD from the syndrome decoding circuit 112, and may generate the decoding status flag DSF based on the received syndrome SYD.

Referring to FIG. 5C, the fast DSF generator 115 may include a syndrome checking circuit 115b, a parity error checking circuit 115c, a DSF detecting circuit 115d, and a fast data error checking circuit 115e.

Operations of the syndrome checking circuit 115b, the parity error checking circuit 115c, the DSF detecting circuit 115d of FIG. 5C may be similar to the operations of the syndrome checking circuit 114b, the parity error checking circuit 114c, and the DSF detecting circuit 114d of FIG. 4C.

The DSF generator 114 of the reference example of FIG. 4C generates the error information ERR about the read data RDT using the error vector ERV. In contrast, the fast data error checking circuit 115e of FIG. 5C may generate error information DT_ERR about the read data RDT using the syndrome SYD.

In detail, the fast data error checking circuit 115e may generate the error information DT_ERR about the read data RDT by comparing at least some of the bits of the syndrome SYD with the simplified H-matrix. The simplified H-matrix may be generated based on the H-matrix that is used by the syndrome decoding circuit 112 or based on partial information of the H-matrix.

A configuration of the simplified H-matrix will be described in detail with reference to FIGS. 6 to 8.

As described above, the fast DSF generator 115 according to the present example embodiment may generate the decoding status flag DSF using only the syndrome SYD without the error vector ERV. Accordingly, the operation of generating the decoding status flag DSF may be performed in parallel with the syndrome decoding operation, and the whole latency of the ECC decoder ECC-DEC-1 may be decreased.

Stated another way, as described for the reference example of FIGS. 4A to 4C, the latency that is required to generate the decoding status flag DSF from a time point when the syndrome decoding operation is completed may be the latency corresponding to a total of 7 OR operation circuit stages, one INV operation circuit stage, and one AND operation circuit stage. On the other hand, as described with reference to the present example embodiment of FIGS. 5A to 5C, the latency that is required to generate the decoding status flag DSF from a time point when the syndrome decoding operation is completed may be a latency corresponding to a total of 4 OR operation circuit stages, one INV operation circuit stage, and one AND operation circuit stage, through the fast DSF generator 115.

Thus, according to the present example embodiment, the decoding status flag DSF may be generated using only the syndrome SYD without the error vector ERV, such that the whole latency of the ECC decoder ECC-DEC-1 may be decreased.

FIGS. 6, 7A, 7B, and 7C are diagrams illustrating some examples of an H-matrix used by a syndrome decoding circuit of FIG. 5A. FIG. 8 is a diagram illustrating some examples of a simplified H-matrix generated based on an H-matrix of FIGS. 6 to 7C.

In the present example embodiment, a simplified H-matrix sim-H-mat may be used by the fast data error checking circuit 115e.

Figure 6:
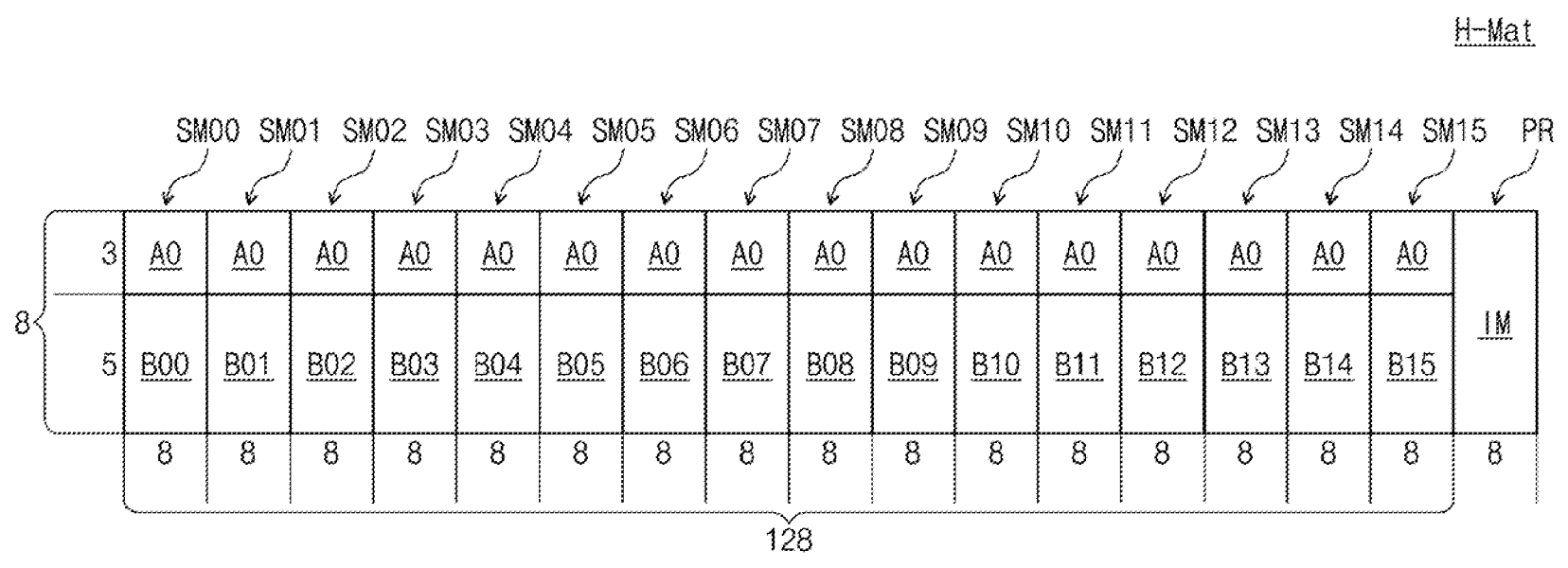
Figure 7B:
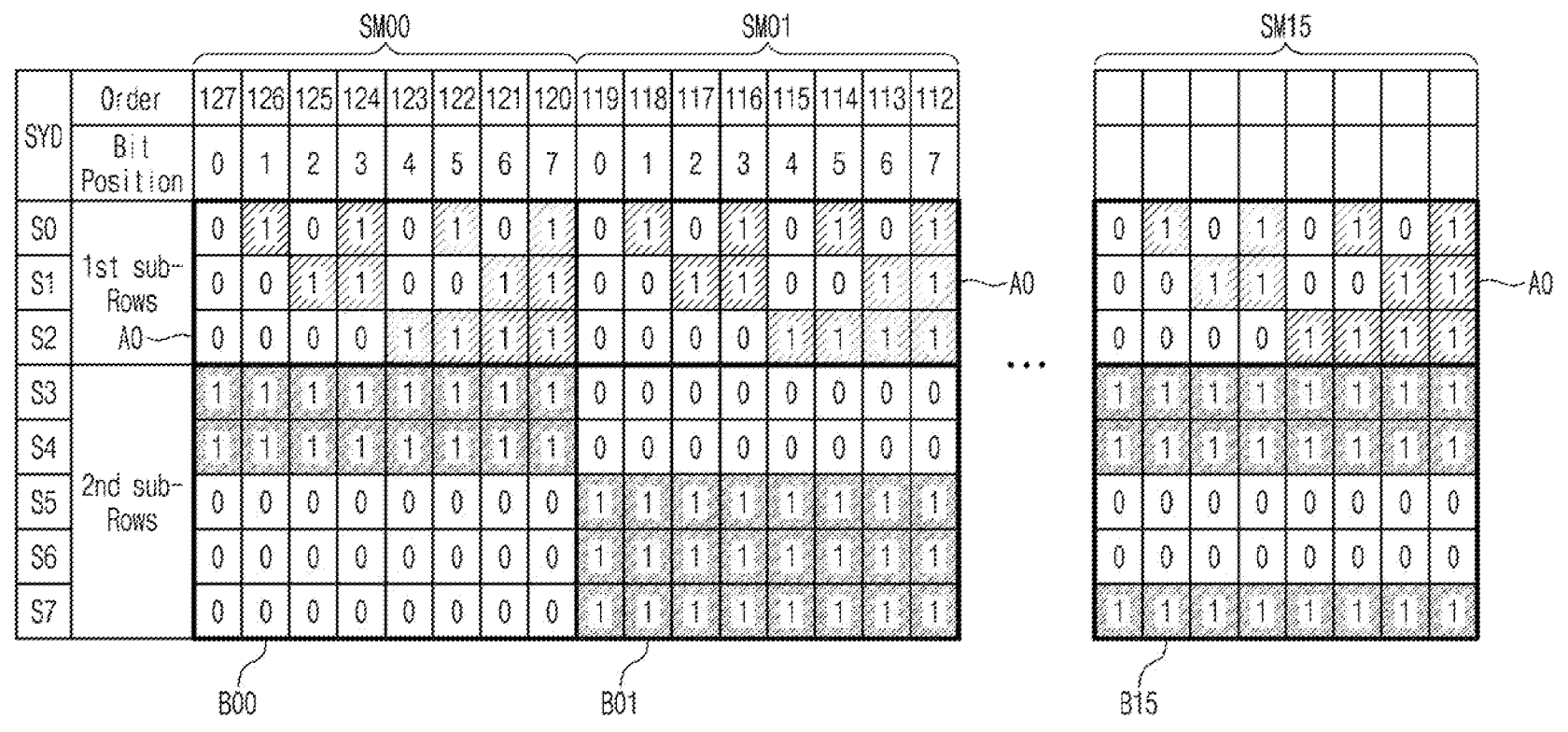
Figure 7C:
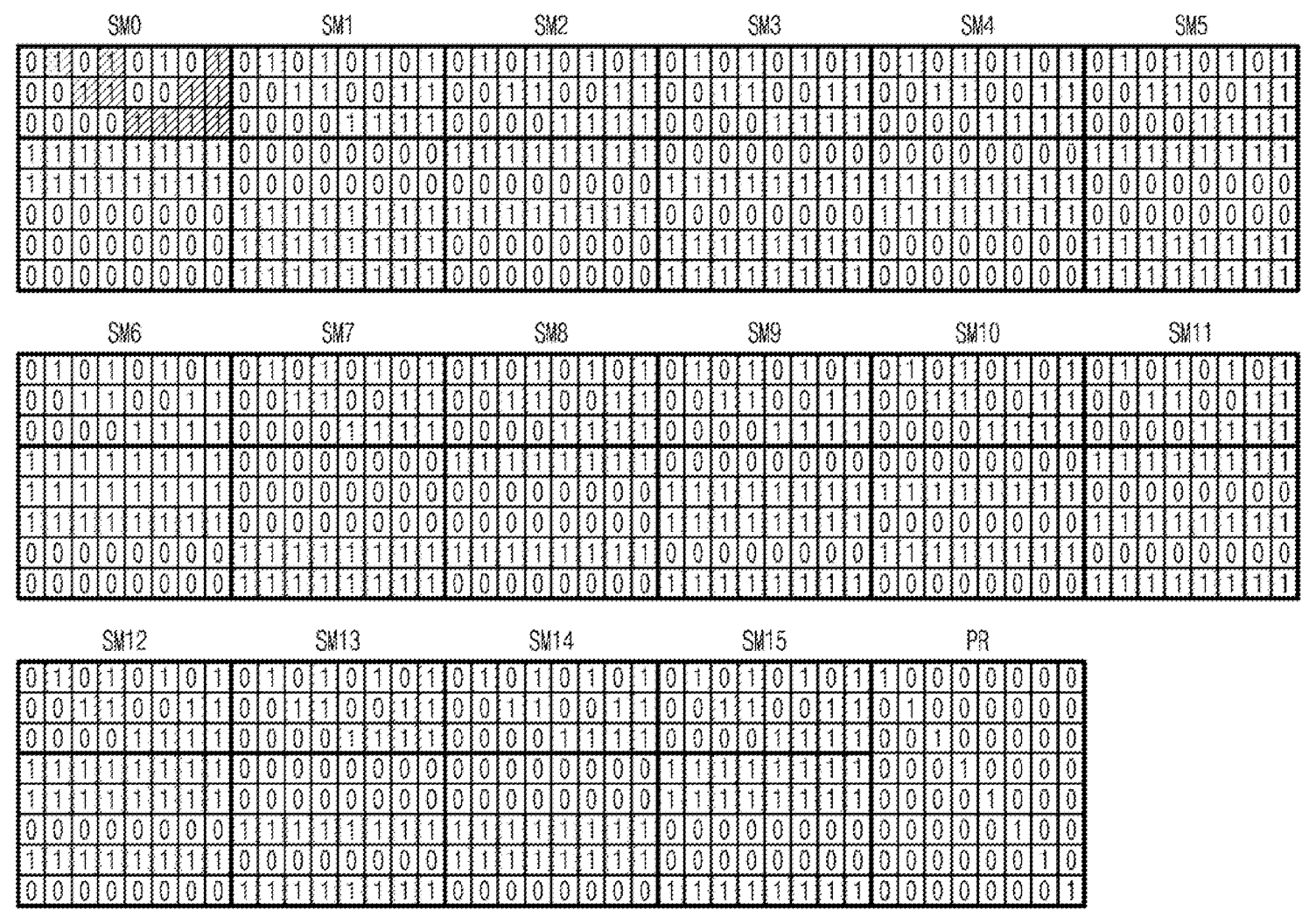
Figure 8:
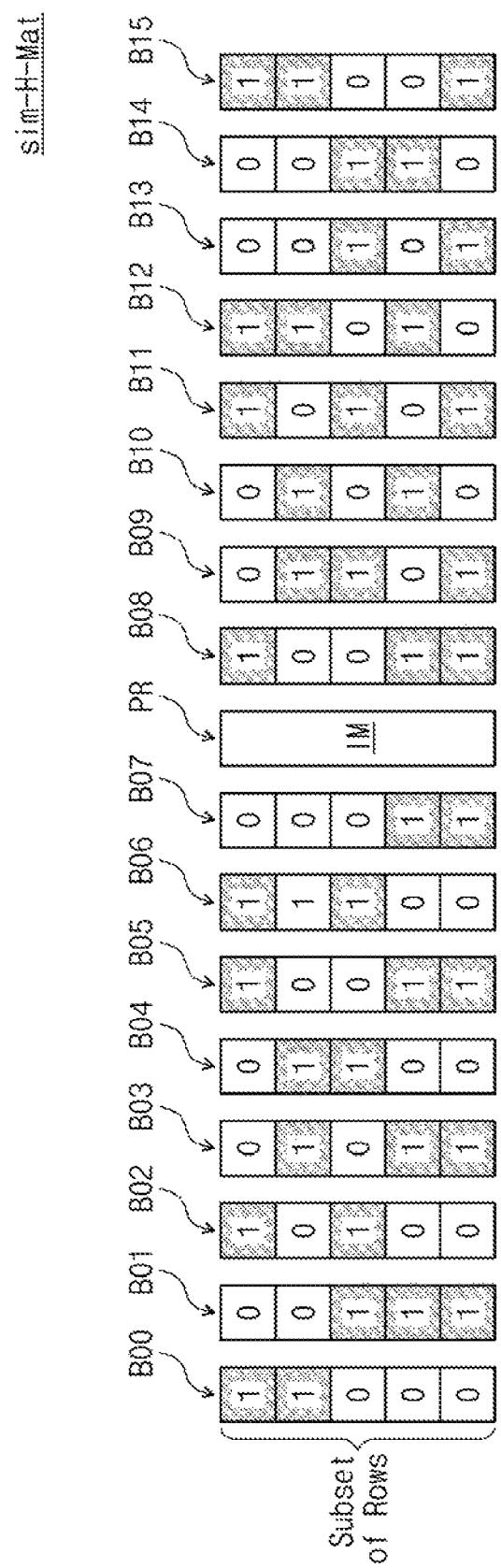
FIG. 8 is a diagram illustrating some examples of a simplified H-matrix generated based on an H-matrix of FIGS. 6 to 7C.

In an example embodiment, an H-matrix H-mat, which will now be described with reference to FIGS. 6 to 8, is an example of the H-matrix for single bit error correction (SEC). However, it will be understood that the H-matrix and the simplified H-matrix may be variously modified or changed depending an implementation of the memory device 100 or the ECC circuit 110.

Referring to FIGS. 6, 7B, and 7C, the H-matrix H-mat may include a plurality of sub-matrices SM00 to SM15 and a parity matrix PR. Referring to FIG. 7A, the parity matrix PR may be an identity matrix IM of dimension 8×8. The eight rows of the parity matrix PR may respectively correspond to each of eight bits (e.g., S0, S1, S2, S3, S4, S5, S6, and S7) of the syndrome SYD.

Each of the plurality of sub-matrices SM00 to SM15 may be of dimension 8×8. The plurality of sub-matrices SM00 to SM15 may be arranged to have a given rule.

For example, three rows of each of the plurality of sub-matrices SM00 to SM15 may constitute an A0-th segment matrix A0. That is, the three rows of each of the plurality of sub-matrices SM00 to SM15 may have the same repetitive pattern.

Also, the remaining rows, that is, five rows of each of the plurality of sub-matrices SM00 to SM15, may constitute each of B00-th to B15-th sub-matrices B00 to B15. The B00-th to B15-th sub-matrices B00 to B15 may be configured to have the same column.

In detail, referring to FIG. 7B, each row of the H-matrix H-mat may correspond to each of the bits (e.g., S0, S1, S2, S3, S4, S5, S6, and S7) of the syndrome SYD.

For example, the A0-th sub-matrix A0 may be placed at first sub-rows (e.g., rows corresponding to S0, S1, and S2) of the 00-th sub-matrix SM00 of the H-matrix H-mat, and the A0-th sub-matrix A0 may be placed at first sub-rows (e.g., rows corresponding to S0, S1, and S2) of the 01-th sub-matrix SM01. Likewise, the A0-th sub-matrix A0 may be placed at first sub-rows (e.g., rows corresponding to S0, S1, and S2) of the 15-th sub-matrix SM15.

Similarly, the B00-th sub-matrix B00 may be placed at second sub-rows (e.g., rows corresponding to S3, S4, S5, S6, and S7) of the 00-th sub-matrix SM00 of the H-matrix H-mat, and the B01-th sub-matrix B01 may be placed at second sub-rows (e.g., rows corresponding to S3, S4, S5, S6, and S7) of the 01-th sub-matrix SM01. Likewise, the B15-th sub-matrix B15 may be placed at second sub-rows (e.g., rows corresponding to S3, S4, S5, S6, and S7) of the 15-th sub-matrix SM15.

In the first sub-rows 1st sub-Rows (e.g., rows corresponding to S0, S1, and S2) of the H-matrix H-mat, a pattern in which the same matrix is repeatedly placed in units of a sub-matrix (i.e., in units of 8 columns) may be formed. In the second sub-rows 2nd sub-Rows (e.g., rows corresponding to S3, S4, S5, S6, and S7) of the H-matrix H-mat, a pattern in which different sub-matrices are placed in units of a sub-matrix (i.e., in units of 8 columns) may be formed. Likewise, columns in the same sub-matrix of the second sub-rows (e.g., rows corresponding to S3, S4, S5, S6, and S7) of the H-matrix H-mat may be identical to each other.

The H-matrix H-mat may be implemented referring to FIG. 7C, by combining the parity matrix PR and the sub-matrices SM00 to SM15 described with reference to FIGS. 7A and 7B. The syndrome decoding circuit 112 may generate the error vector ERV having 128b by comparing each bit of the syndrome SYD and each column of the H-matrix H-mat of FIG. 7C. For example, the syndrome decoding circuit 112 may search for a column that is identical to the syndrome SYD from among the plurality of columns of the H-matrix H-mat, and may generate the error vector ERV based on a found result. A bit of a position corresponding to the column that is identical to the syndrome SYD from among the plurality of columns of the H-matrix H-mat may indicate an error detected from the read data RDT.

The case where all the bits of the syndrome SYD are not "0" (i.e., the syndrome SYD is non-zero) but a column that is identical to the syndrome SYD is absent from the plurality of columns of the H-matrix H-mat may indicate that an uncorrectable error is included in the read data RDT.

The H-matrix H-mat illustrated in FIG. 7C is merely an example of the H-matrix for the single bit error correction (SEC), and may be varied.

In the case where the H-matrix H-mat is implemented referring to FIG. 7C, the simplified H-matrix sim-H-mat may be generated or determined referring to FIG. 8.

For example, referring to FIG. 8, the simplified H-matrix sim-H-mat may be generated based on information of some rows (e.g., the second sub-rows 2nd sub-Rows) of the H-matrix H-mat.

In detail, as described above, the H-matrix H-mat may be divided into the plurality of sub-matrices SM00 to SM15. Each of the plurality of sub-matrices SM00 to SM15 may be of dimension 8×8. That is, the H-matrix H-mat may be divided in units of 8 columns (i.e., in units having 8b). In this case, in each of the plurality of sub-matrices SM00 to SM15, the first sub-rows 1st sub-Rows (e.g., rows corresponding to S0, S1, and S2) may constitute the same A0-th sub-matrix A0, and each column of the A0-th sub-matrix A0 indicates all combinations capable of being expressed by three bits. In other words, this means that the first sub-rows 1st sub-Rows (e.g., rows corresponding to S0, S1, and S2) of the H-matrix H-mat have a function of specifying an accurate position of an error through comparison with the bits S0, S1, and S2 of the syndrome SYD, and are not used to determine whether an error occurs.

In contrast, the second sub-rows 2nd sub-Rows (e.g., rows corresponding to S3, S4, S5, S6, and S7) of the H-matrix H-mat are composed of the B00-th to B15-th sub-matrices B00 to B15. In this case, the B00-th to B15-th sub-matrices B00 to B15 have different bit columns. However, in the same sub-matrix, that is, in each of the B00-th to B15-th sub-matrices B00 to B15, all the columns have the same value. In this case, the second sub-rows 2nd sub-Rows (e.g. rows corresponding to S3, S4, S5, S6, and S7) of the H-matrix H-mat may be expressed by 16 bit columns. In this case, the number of bit columns capable of being combined through 5 bits is 32. That is, in the second sub-rows 2nd sub-Rows (e.g., rows corresponding to S3, S4, S5, S6, and S7) of the H-matrix H-mat, whether an error is detected may be determined by comparing each column with the bits S3, S4, S5, S6, and S7 of the syndrome SYD.

According to an example embodiment, the simplified H-matrix sim-H-mat may be generated using information about some of the remaining rows other than rows necessary to specify an error position in the H-matrix H-mat, as described above. In this case, referring to FIG. 8, the simplified H-matrix sim-H-mat may include the B00-th to B15-th sub-matrices B00 to B15 and the parity matrix PR. The B00-th to B15-th sub-matrices B00 to B15 may have a structure in which bit columns such as $[11000]^T$, $[00111]^T$, $[10100]^T$, $[01011]^T$, $[01100]^T$, $[10011]^T$, $[11100]^T$, $[00011]^T$, $[10011]^T$, $[01101]^T$, $[01010]^T$, $[10101]^T$, $[11010]^T$, $[00101]^T$, $[00110]^T$, and $[11001]^T$ are repeated in units of 8 (i.e., in units having 8b). The parity matrix PR may be the identity matrix IM of dimension 8×8.

The simplified H-matrix sim-H-mat illustrated in FIG. 8 may be generated from the H-matrix H-mat described with reference to FIGS. 6 to 7C, and whether an error is included in the read data RDT may be checked by comparing some bits S3, S4, S5, S6, and S7 of the syndrome SYD with each column of the simplified H-matrix sim-H-mat.

The simplified H-matrix sim-H-mat illustrated in FIG. 8 is merely an example, and may be varied. For example, the simplified H-matrix sim-H-mat illustrated in FIG. 8 may be composed of a plurality of sub-matrices obtained by dividing the H-matrix H-mat in units having 8b, but the H-matrix H-mat may be divided in units of 4b, 16 bits, or N bits (N being a natural number) depending on an implementation of the H-matrix H-mat. In this case, the dimension of the simplified H-matrix may be variously changed or modified.

Some examples of components (e.g., the syndrome checking circuit 115b, the parity error checking circuit 115c, the fast data error checking circuit 115e, and the DSF detecting circuit 115d) of a fast DSF generator configured to generate the decoding status flag DSF based on the simplified H-matrix sim-H-mat of FIG. 8 will now be described with reference to FIGS. 9 to 13. However, a configuration of logical operation circuits associated with the components of the fast DSF generator may be variously changed or modified depending on a way to implement or depending on the H-matrix or the simplified H-matrix.

Also, for brevity of drawing and for convenience of description, in the following drawings, the syndrome SYD has a size having 8b, and bits of the syndrome SYD are respectively marked by S0, S1, S2, S3, S4, S5, S6, and S7, and bits (hereinafter referred to as "complementary bits") that correspond to inverted versions of the bits S0, S1, S2, S3, S4, S5, S6, and S7 of the syndrome SYD are respectively marked by S0B, S1B, S2B, S3B, S4B, S5B, S6B, and S7B.

Figure 9:
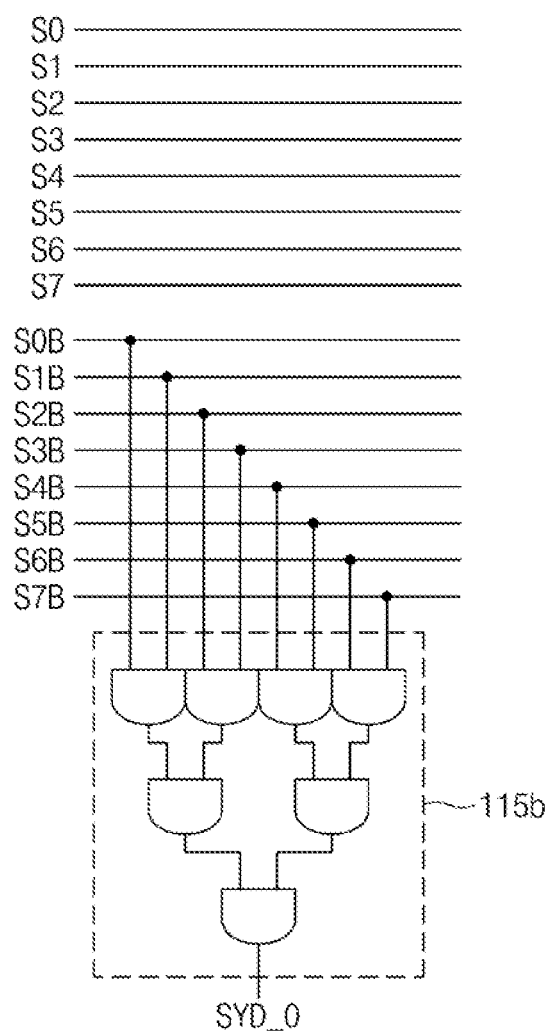
FIG. 9 is a diagram illustrating an example of a syndrome checking circuit of a fast DSF generator of FIG. 5C.

FIG. 9 is a diagram illustrating an example of a syndrome checking circuit of a fast DSF generator of FIG. 5C.

The syndrome checking circuit 115b may check whether all the bits S0 to S7 of the syndrome SYD are "0" (i.e., are all-zero). For example, the syndrome checking circuit 115b may be configured to perform the AND operation on the bits S0B, S1B, S2B, S3B, S4B, S5B, S6B, and S7B complementary to the bits (e.g., S0 to S7) of the syndrome SYD. In this case, as AND gates with two input terminals are connected in a 3-stage structure, whether all the bits S0 to S7 of the syndrome SYD are "0" (i.e., are all-zero) may be checked.

When all the bits S0 to S7 of the syndrome SYD are "0", a value of "1" may be output from the syndrome checking circuit 115b of FIG. 9 as the syndrome information SYD_0. When at least one (e.g., at least one of S0 to S7) of the syndrome SYD is "1", a value of "0" may be output from the syndrome checking circuit 115b of FIG. 9 as the syndrome information SYD_0.

In other words, that the syndrome information SYD_0 output from the syndrome checking circuit 115b of FIG. 9 has a value of "1" means that an error is absent from the read data RDT and the parity data PRT corresponding to the syndrome SYD; on the other hand, that the syndrome information SYD_0 output from the syndrome checking circuit 115b of FIG. 9 has a value of "0" means that an error is present in the read data RDT and the parity data PRT corresponding to the syndrome SYD.

Figure 10:
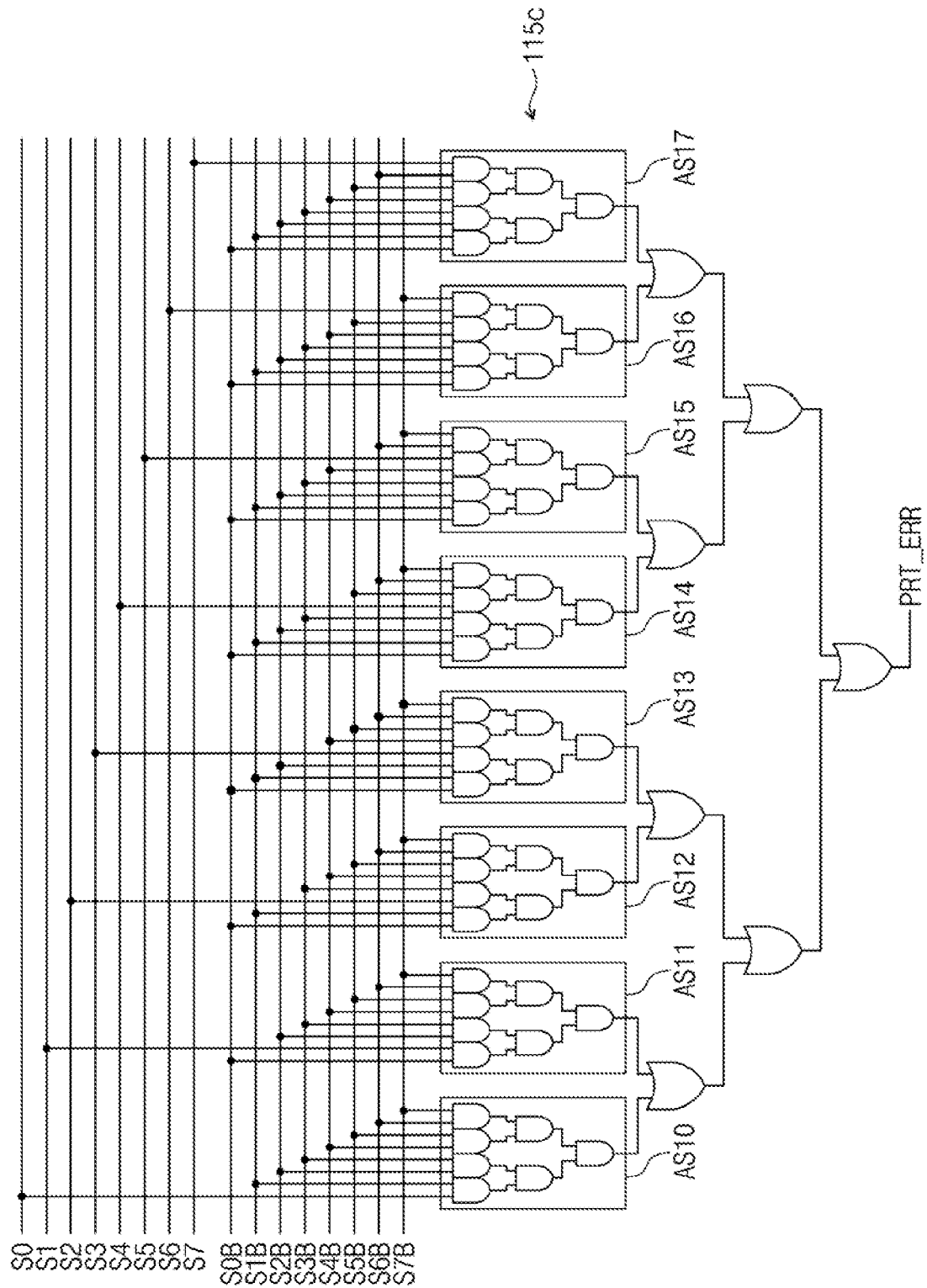
FIG. 10 is a diagram illustrating an example of a parity error checking circuit of a fast DSF generator of FIG. 5C.

FIG. 10 is a diagram illustrating an example of a parity error checking circuit of a fast DSF generator of FIG. 5C.

Referring to FIGS. 5C and 10, the parity error checking circuit 115c may detect whether an error is present in the parity data PRT, based on the syndrome SYD.

In an example embodiment, whether an error is present in the parity data PRT may be detected based on the parity data PRT of the simplified H-matrix sim-H-mat described with reference to FIG. 8 or the parity data PRT described with reference to FIG. 7A. For example, the parity error checking circuit 115c may include a plurality of AND operation circuits AS10 to AS17. The plurality of AND operation circuits AS10 to AS17 may be respectively connected with the bits S0 to S7 of the syndrome SYD based on the parity data PRT of the simplified H-matrix sim-H-mat described with reference to FIG. 8 or the parity data PRT described with reference to FIG. 7A.

In detail, the 10th AND operation circuit AS10 may be connected with bits of the syndrome SYD so as to correspond to the 0-th column (i.e., $[1, 0, 0, 0, 0, 0, 0, 0]^T$) of the parity matrix PR. That is, the 10th AND operation circuit AS10 receives the bits S0, S1B, S2B, S3B, S4B, S5B, S6B, and S7B as inputs. When all the inputs are "1", the 10th AND operation circuit AS10 outputs "1"; if not (i.e., when at least one of the inputs is "0"), the 10th AND operation circuit AS10 outputs "0". The 11th AND operation circuit AS11 may be connected with bits of the syndrome SYD so as to correspond to the 1st column (i.e., $[0, 1, 0, 0, 0, 0, 0, 0]^T$) of the parity matrix PR. That is, the 11th AND operation circuit AS11 receives the bits S0B, S1, S2B, S3B, S4B, S5B, S6B, and S7B as inputs. When all the inputs are "1", the 11th AND operation circuit AS11 outputs "1"; if not (i.e., when at least one of the inputs is "0"), the 11th AND operation circuit AS11 outputs "0". Likewise, each of the 12th to 17th AND operation circuits AS12 to AS17 may be connected with bits of the syndrome SYD so as to correspond to each of the 2nd to 7th columns of the parity matrix PR. When all the inputs are "1", each of the 12th to 17th AND operation circuits AS12 to AS17 outputs "1"; if not (i.e., when at least one of the inputs is "0"), each of the 12th to 17th AND operation circuits AS12 to AS17 outputs "0".

That is, through the plurality of AND operation circuits AS10 to AS17, the syndrome SYD may be compared with each column of the parity matrix PR, and whether a column of the same bits (or bit pattern) as the syndrome SYD exists may be determined. That a column having the same bit pattern as the syndrome SYD is present in the columns of the parity matrix PR means that an error is present in the parity data PRT.

The parity error checking circuit 115c may include a plurality of OR gates. The parity error checking circuit 115c may output the parity error information PRT_ERR by performing an OR operation on outputs of the plurality of AND operation circuits AS10 to AS17 through the plurality of OR gates. In an example embodiment, when at least one of the outputs of the plurality of AND operation circuits AS10 to AS17 is "1", the parity error information PRT_ERR has a value of "1"; when all the outputs of the plurality of AND operation circuits AS10 to AS17 are "0", the parity error information PRT_ERR has a value of "0".

In an example embodiment, that the parity error information PRT_ERR has a value of "1" indicates that an error is present in the parity data PRT corresponding to the syndrome SYD; that the parity error information PRT_ERR has a value of "0" indicates that an error is absent from the parity data PRT corresponding to the syndrome SYD.

Figure 11:
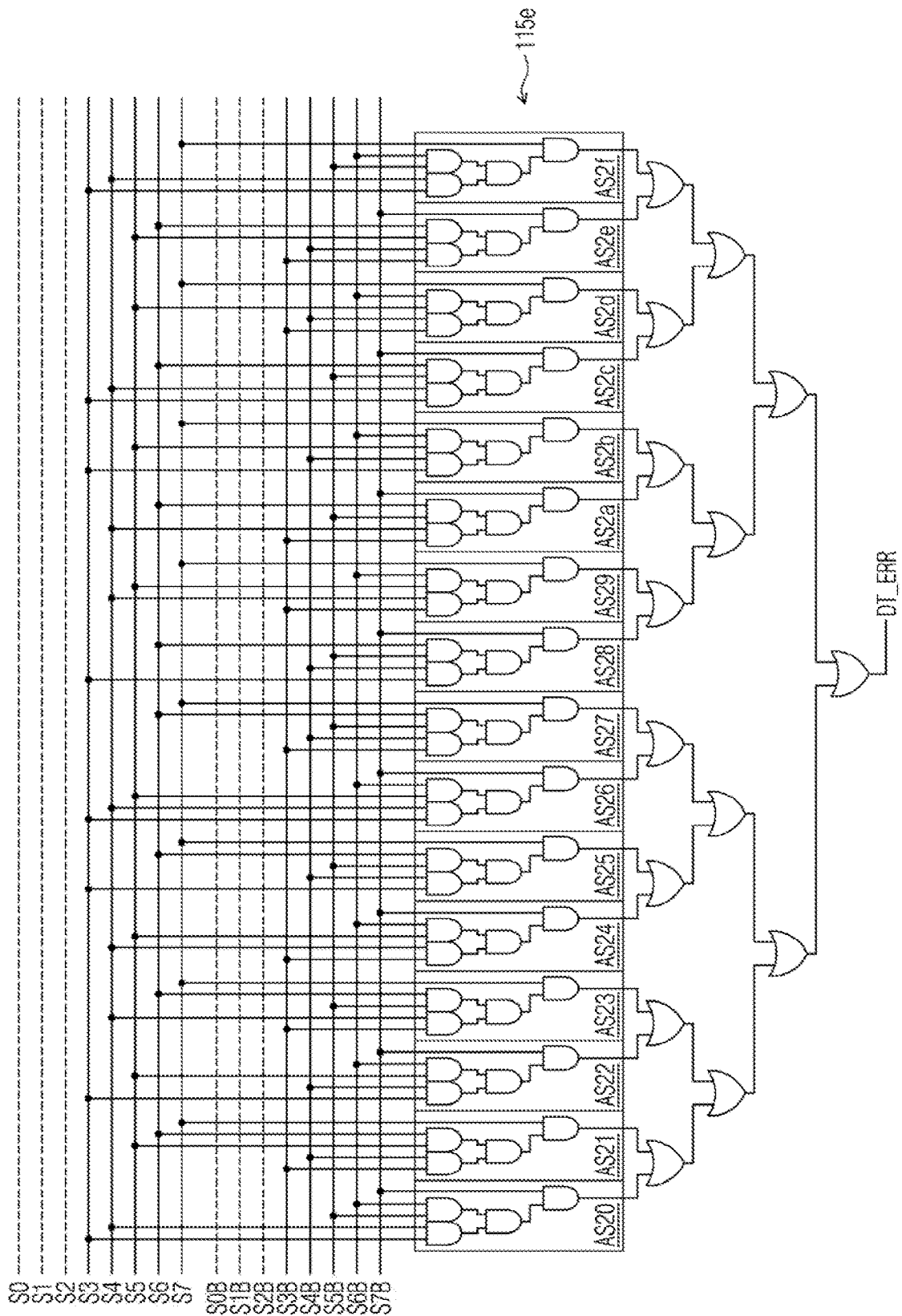
FIG. 11 is a diagram illustrating an example of a fast data error checking circuit of a fast DSF generator of FIG. 5C.

FIG. 11 is a diagram illustrating an example of a fast data error checking circuit of a fast DSF generator of FIG. 5C.

Referring to FIGS. 5C and 11, the fast data error checking circuit 115e may determine whether an error is present in data, based on the syndrome SYD.

In an example embodiment, whether an error is present in data may be detected based on the simplified H-matrix sim-H-mat described with reference to FIG. 8.

For example, the fast data error checking circuit 115e may include a plurality of AND operation circuits AS20 to AS2f. The plurality of AND operation circuits AS20 to AS2f may be connected with some bits S3 to S7 of the syndrome SYD based on the simplified H-matrix sim-H-mat described with reference to FIG. 8.

In detail, the 20th AND operation circuit AS20 may be connected with some bits S3 to S7 of the syndrome SYD so as to correspond to a column (i.e., $[1, 1, 0, 0, 0]^T$) of the B00-th sub-matrix B00 of the simplified H-matrix sim-H-mat of FIG. 8. That is, the 20th AND operation circuit AS20 receives the bits S3, S4, S5B, S6B, and S7B as inputs. When all the inputs are "1", the 20th AND operation circuit AS20 outputs "1"; if not (i.e., when at least one of the inputs is "0"), the 20th AND operation circuit AS20 outputs "0".

Also, the 21st AND operation circuit AS21 may be connected with some bits S3 to S7 of the syndrome SYD so as to correspond to a column (i.e., $[0, 0, 1, 1, 1]^T$) of the B01-th sub-matrix B01 of the simplified H-matrix sim-H-mat of FIG. 8. That is, the 21st AND operation circuit AS21 receives the bits S3B, S4B, S5, S6, and S7 as inputs. When all the inputs are "1", the 21st AND operation circuit AS21 outputs "1"; if not (i.e., when at least one of the inputs is "0"), the 21st AND operation circuit AS21 outputs "0".

Likewise, the 22nd to 2f-th AND operation circuits AS22 to AS2f may be connected with some bits S3 to S7 of the syndrome SYD so as to correspond to columns of the B02-th to B15-th sub-matrices B02 to B15 of the simplified H-matrix sim-H-mat of FIG. 8, respectively. Each of the 22nd to 2f-th AND operation circuits AS22 to AS2f outputs "1" when all the inputs are "1" and outputs "0" if not (when at least one of the inputs is "0").

As some bits (e.g., S3 to S7) of the syndrome SYD are compared with each column of the simplified H-matrix sim-H-mat or each sub-matrix through the plurality of AND operation circuits AS20 to AS2f, whether a column having the same bit pattern as some bits S3 to S7 of the syndrome SYD is present in the simplified H-matrix sim-H-mat may be determined. That a column having the same bit pattern as some bits S3 to S7 of the syndrome SYD is present in the simplified H-matrix sim-H-mat may mean that an error is present in the read data RDT. However, because only some bits of the syndrome SYD are compared through the simplified H-matrix sim-H-mat, a position of an error is not detected.

The fast data error checking circuit 115e may further include a plurality of OR gates. The fast data error checking circuit 115e may output the data error information DT_ERR by performing an OR operation on outputs of the plurality of AND operation circuits AS20 to AS2f through the plurality of OR gates. In an example embodiment, when at least one of the outputs of the plurality of AND operation circuits AS20 to AS2f is "1", the data error information DT_ERR has a value of "1"; when all the outputs of the plurality of AND operation circuits AS20 to AS2f are "0", the data error information DT_ERR has a value of "0". In an example embodiment, that the data error information DT_ERR indicates "1" may indicate that an error is present in the read data RDT; that the data error information DT_ERR indicates "0" may indicate that an error is absent from the read data RDT.

Figure 12:
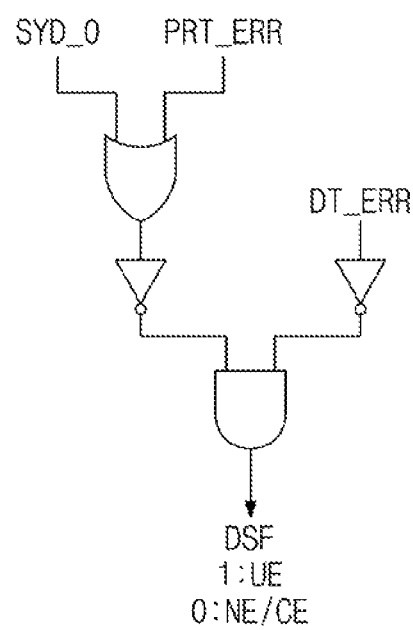
FIG. 12 is a diagram illustrating an example of a DSF detecting circuit of a fast DSF generator of FIG. 5C.

FIG. 12 is a diagram illustrating an example of a DSF detecting circuit of a fast DSF generator of FIG. 5C.

Referring to FIGS. 5C and 12, the DSF detecting circuit 115d may receive the syndrome information SYD_0 from the syndrome checking circuit 115b, may receive the parity error information PRT_ERR from the parity error checking circuit 115c, and may receive the data error information DT_ERR from the fast data error checking circuit 115e.

The DSF detecting circuit 115d may include an OR gate, INV gates, and an AND gate. The DSF detecting circuit 115d may generate the decoding status flag DSF by performing an OR operation on the syndrome information SYD_0 and the parity error information PRT_ERR through the OR gate, the INV gates, and the AND gate, and by performing an AND operation on an inverted value of an output of the OR gate and an inverted value of the data error information DT_ERR.

That the decoding status flag DSF thus generated has a value of "1" indicates that the decoding status is the "UE"; that the decoding status flag DSF thus generated has a value of "0" indicates that the decoding status is the "CE" or "NE".

For example, according to the DSF detecting circuit 115d illustrated in FIG. 12, when the syndrome information SYD_0 indicates "0", the parity error information PRT_ERR indicates "0", and the data error information DT_ERR indicates "0", the decoding status flag DSF may have a value of "1". In other words, in the case where that an error is present in the read data RDT or the parity data PRT is determined by the syndrome information SYD_0 of "0", that an error is absent from the parity data PRT is determined by the parity error information PRT_ERR of "0", and that an error is absent from data is determined by the data error information DT_ERR of "0", because conditions for pieces of information do not coincide with each other, the error-corrected read data RDT_cor that are finally output may be determined as including an uncorrectable error (i.e., the decoding status may be determined to be the "UE"). In the remaining cases other than the above case, the decoding status flag DSF may have a value of "0"; in this case, the error-corrected read data RDT_cor may be determined to be normal data or data whose error is normally corrected (i.e., the decoding status may be determined to be the "CE" or "NE").

As described above, according to the present example embodiment, the fast DSF generator 115 may generate the decoding status flag DSF using the syndrome SYD without the error vector ERV generated by the syndrome decoding circuit 112. In this case, because the fast DSF generator 115 operates in parallel with the syndrome decoding circuit 112, the whole latency of the ECC decoder ECC-DEC-1 may be shortened. Also, because the fast data error checking circuit 115e of the fast DSF generator 115 compares some bits of the syndrome SYD with the simplified H-matrix sim-H-mat, the complexity of lines for respective bits of the syndrome SYD may be decreased.

Figure 13:
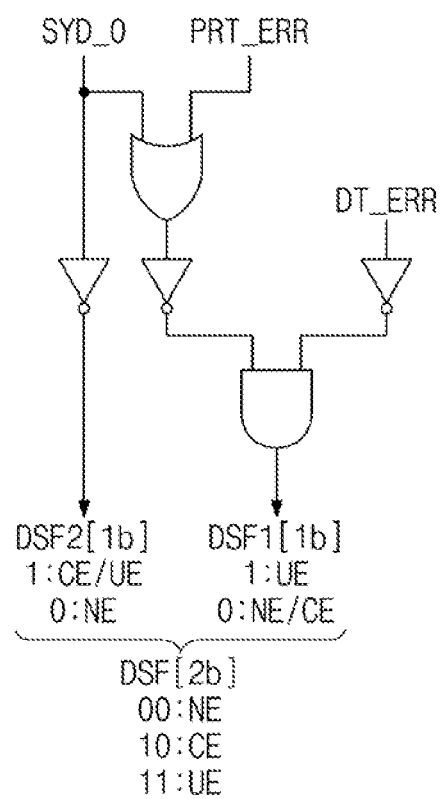
FIG. 13 is a block diagram illustrating an example of a DSF detecting circuit of a fast DSF generator of FIG. 5C.

FIG. 13 is a block diagram illustrating an example of a DSF detecting circuit of a fast DSF generator of FIG. 5C.

For convenience of description, thus, additional description associated with the components described with reference to FIG. 12 will be omitted to avoid redundancy.

Referring to FIGS. 5C and 13, a DSF detecting circuit 115d-1 may generate the decoding status flag DSF of 1b through a method similar to that described with reference to FIG. 12. In this case, a first decoding status flag DSF1 is similar to the decoding status flag DSF described with reference to FIG. 12. That is, that the first decoding status flag DSF1 indicates "1" means that the decoding status is the "UE"; that the first decoding status flag DSF1 indicates "0" means that the decoding status is the "NE" or "CE".

The DSF detecting circuit 115d-1 of FIG. 13 may invert the syndrome information SYD_0 to generate a second decoding status flag DSF2 of 1b. That is, that the second decoding status flag DSF2 indicates "1" means that an error is present in the read data RDT or the parity data PRT; that the second decoding status flag DSF2 indicates "0" means that an error is absent from the read data RDT and the parity data PRT. In other words, that the second decoding status flag DSF2 indicates "1" means that the decoding status is the "CE" or "UE"; that the second decoding status flag DSF2 indicates "0" means that the decoding status is the "NE".

The DSF detecting circuit 115d-1 of FIG. 13 may combine the first and second decoding status flags DSF1 and DSF2 to output the decoding status flag DSF of 2b. For example, in the decoding status flag DSF, a least significant bit LSB may correspond to the first decoding status flag DSF1, and a most significant bit MSB may correspond to the second decoding status flag DSF2. In this case, that the decoding status flag DSF of 2b are "00" may mean that the decoding status is the "NE"; that the decoding status flag DSF of 2b are "10" may mean that the decoding status is the "CE"; that the decoding status flag DSF of 2b are "11" may mean that the decoding status is the "UE".

The above bit combination and bit values are only examples, and it will be understood that the above bit combination and bit values may be variously changed or modified depending on an implementation of the ECC decoder.

As described above, the DSF detecting circuit 115d-1 may notify the decoding result (e.g., UE, CE, and NE) to the memory controller 11 by generating the decoding status flag DSF of 2b.

Figure 14:
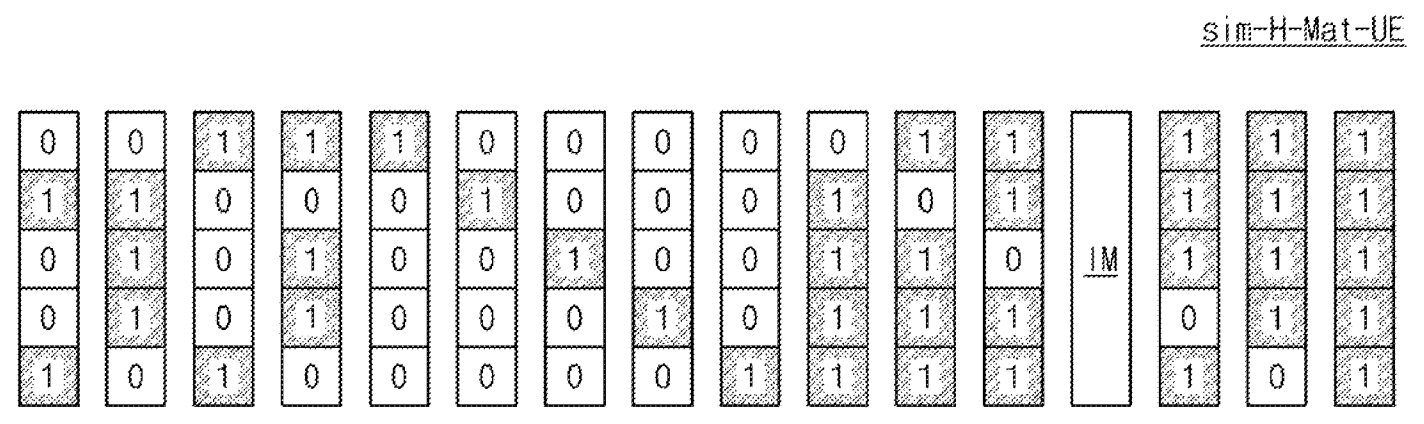

FIG. 14 is a diagram illustrating an example of a simplified H-matrix according to an example embodiment.

The simplified H-matrix sim-H-mat described with reference to FIG. 8 is generated based on information of the second sub-rows 2nd sub-Rows of the H-matrix H-mat that is used by the syndrome decoding circuit 112. In contrast, a simplified H-matrix sim-H-mat_UE for UE determination illustrated in FIG. 14 may be generated based on information that is not included in the information of the second sub-rows 2nd sub-Rows of the H-matrix H-mat.

For example, as described with reference to FIG. 8, the B00-th to B15-th sub-matrices B00 to B15 included in the simplified H-matrix sim-H-mat may be implemented with columns of $[11000]^T$, $[00111]^T$, $[10100]^T$, $[01011]^T$, $[01100]^T$, $[10011]^T$, $[11100]^T$, $[00011]^T$, $[10011]^T$, $[01101]^T$, $[01010]^T$, $[10101]^T$, $[11010]^T$, $[00101]^T$, $[00110]^T$, and $[11001]^T$, and the B00-th to B15-th sub-matrices B00 to B15 may constitute the second sub-rows 2nd sub-Rows of the H-matrix H-mat.

In contrast, referring to FIG. 14, the simplified H-matrix sim-H-mat UE for UE determination may be implemented with sub-matrices such as $[01001]^T$, $[01110]^T$, $[10001]^T$, $[10110]^T$, $[10000]^T$, $[01000]^T$, $[00100]^T$, $[00010]^T$, $[00001]^T$, $[01111]^T$, $[10111]^T$, $[11011]^T$, $[11101]^T$, $[11110]^T$, and $[11111]^T$. Sub-matrices of the simplified H-matrix sim-H-mat UE for UE determination may be implemented with columns different from those of sub-matrices (i.e., B00 to B15) included in the second sub-rows 2nd sub-Rows of the H-matrix H-mat.

In detail, columns included in the second sub-rows 2nd sub-Rows of the H-matrix H-mat described with reference to FIGS. 7A to 7C are divided by "16" (except for the parity matrix PR). In this case, because the number of combinations of bit columns through 5 bits is 32 ($=2^5$), the number of bit columns that do not correspond to the sub-matrices (i.e., B00 to B15) is 16 ($=32-16$). In this case, a column of $[00000]^T$ corresponds to the case where the syndrome SYD is all-zero (i.e., the case where there is no error), and the column of $[00000]^T$ is excluded from the simplified H-matrix sim-H-mat_UE for UE determination. Accordingly, the simplified H-matrix sim-H-mat_UE for UE determination may include sub-matrices and the parity matrix PR each composed of 10 columns.

In this case, that a column of the third to seventh bits S3 to S7 of the syndrome SYD coincides with at least one of the columns of the simplified H-matrix sim-H-mat_UE for UE determination means that the syndrome SYD does not coincide with all the columns of the H-matrix H-mat (i.e., that an error position is not determined). Accordingly, whether an error is present in data may be determined by comparing the column of the third to seventh bits S3 to S7 of the syndrome SYD with the columns of the simplified H-matrix sim-H-mat_UE for UE determination.

In another implementation, in some cases, whether an uncorrectable error is included in data, that is, the decoding result is the "UE", may be determined by comparing the column of the third to seventh bits S3 to S7 of the syndrome SYD with the columns of the simplified H-matrix sim-H-mat_UE for UE determination.

Figure 15:
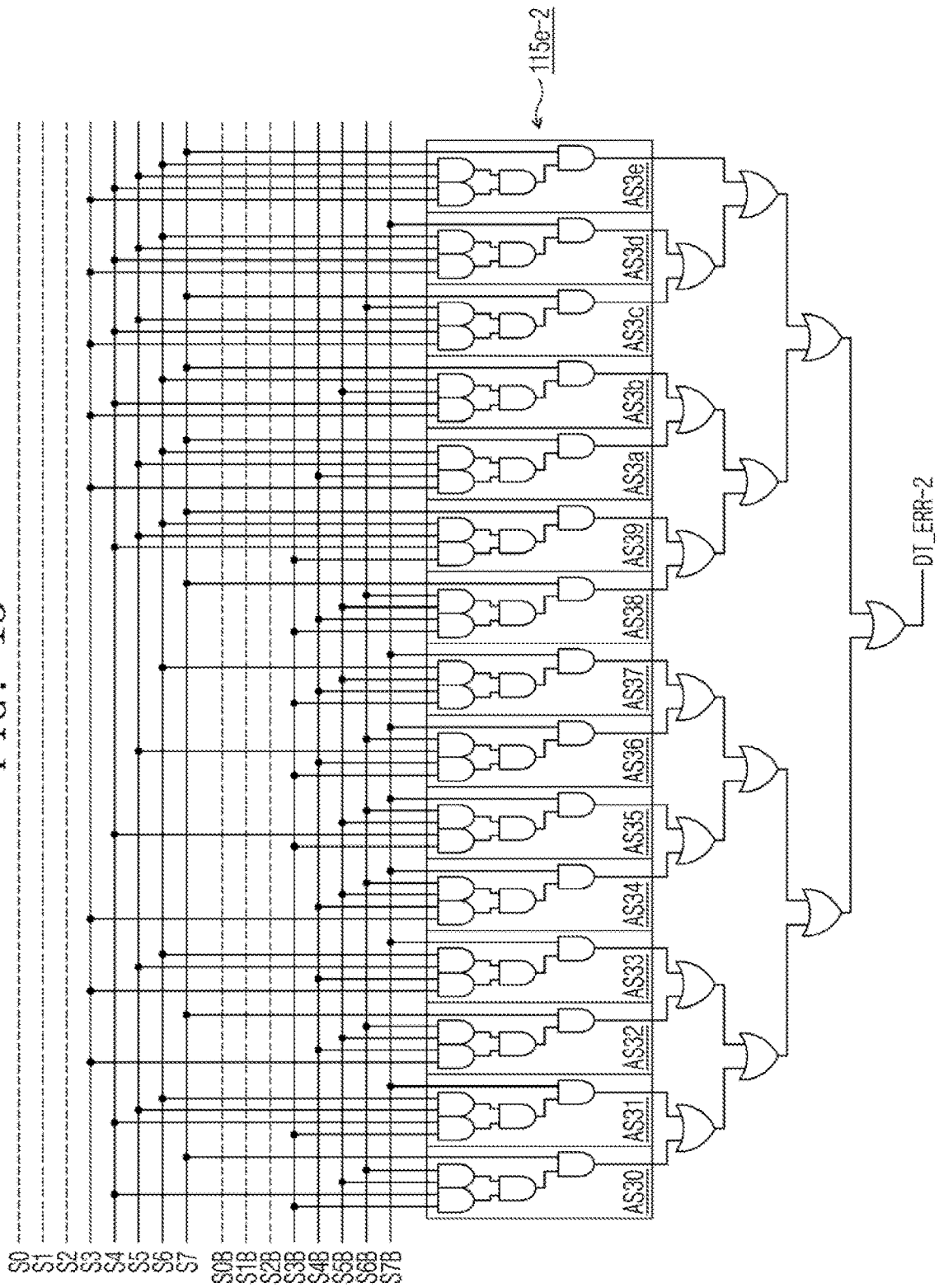
FIG. 15 is a diagram illustrating an example of a fast data error checking circuit using a simplified H-matrix for UE determination of FIG. 14.

FIG. 15 is a diagram illustrating an example of a fast data error checking circuit using a simplified H-matrix for UE determination of FIG. 14.

Referring to FIG. 15, a fast data error checking circuit 115e-2 may include a plurality of AND operation circuits AS30 to AS3e. The plurality of AND operation circuits AS30 to AS3e may be connected with some bits S3 to S7 of the syndrome SYD based on the simplified H-matrix sim-H-mat_UE for UE determination described with reference to FIG. 14.

For example, the 30th AND operation circuit AS30 may be connected with some bits S3 to S7 of the syndrome SYD so as to correspond to $[01001]^T$ of the simplified H-matrix sim-H-mat_UE for UE determination of FIG. 14. That is, the 30th AND operation circuit AS30 receives the bits S3B, S4, S5B, S6B, and S7 as inputs. When all the inputs are "1", the 30th AND operation circuit AS30 outputs "1"; if not (when at least one of the inputs is ""0"), the 30th AND operation circuit AS30 outputs "0".

The remaining AND operation circuits AS31 to AS3e are connected with some bits S3 to S7 of the syndrome SYD so as to respectively correspond to the remaining columns of the simplified H-matrix sim-H-mat_UE for UE determination described with reference to FIG. 14. Each of the AND operation circuits AS31 to AS3e outputs "1" when all the inputs are "1" and outputs "0" if not (when at least one of the inputs is "0").

The fast data error checking circuit 115e-2 may include a plurality of OR gates. The fast data error checking circuit 115e-2 may output data error information DT_ERR-2 by performing an OR operation on outputs of the plurality of AND operation circuits AS30 to AS3e through the plurality of OR gates. In an example embodiment, when at least one of the outputs of the plurality of AND operation circuits AS30 to AS3e is "1", the data error information DT_ERR-2 has a value of "1"; if not (i.e., when all the outputs are "0"), the data error information DT_ERR-2 has a value of "0".

In an example embodiment, that the data error information DT_ERR-2 indicates "1" may mean that an error is present in the read data RDT or an error is present in the parity data PRT. That the data error information DT_ERR-2 indicates "0" may mean that an error is not present in the read data RDT or a correctable error exists.

Figure 16:
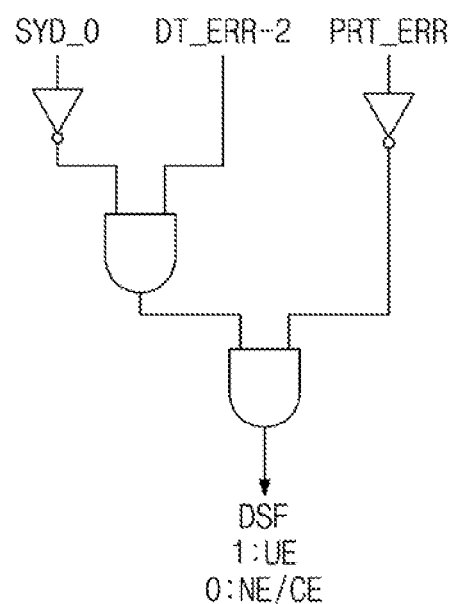
FIG. 16 is a diagram illustrating an example of a DSF detecting circuit using data error information from a fast data error checking circuit of FIG. 15.

FIG. 16 is a diagram illustrating an example of a DSF detecting circuit using data error information from a fast data error checking circuit of FIG. 15.

Referring to FIGS. 14, 15, and 16, a DSF detecting circuit 115d-2 may include first and second INV gates and first and second AND gates. The DSF detecting circuit 115d-2 may invert the syndrome information SYD_0 through the first INV gate. The DSF detecting circuit 115d-2 may perform an AND operation on an output (i.e., inverted syndrome information) of the first INV gate and the data error information DT_ERR-2 through the first AND gate. The DSF detecting circuit 115d-2 may invert the parity error information PRT_ERR through the second INV gate. The parity error information PRT_ERR may be calculated by the parity error checking circuit 115c described with reference to FIG. 10, and refers to information indicating whether a 1-bit error is present in the parity data PRT.

The DSF detecting circuit 115d-2 may generate the decoding status flag DSF by performing an AND operation on an output of the first AND gate and an output of the second INV gate, through the second AND gate. That the decoding status flag DSF has a value of "1" indicates that the decoding status is the "UE"; that the decoding status flag DSF has a value of "0" indicates that the decoding status is the "NE" or "CE".

For example, the decoding status flag DSF having a value "1" corresponds to the case where the syndrome information SYD_0 indicates "0", the data error information DT_ERR-2 indicates "1", and the parity error information PRT_ERR indicates "0". This means the case where that an error is present in data and parity data is detected by the syndrome information SYD_0, that an uncorrectable error is present in data or parity data is detected by the data error information DT_ERR-2, and that an error is absent from the parity matrix PR is detected by the parity error information PRT_ERR. In this case, the ECC decoding result may be the "UE". In contrast, in the remaining cases other than the above case, the ECC decoding result may be the "NE" or "CE".

In an example embodiment, in the case where that an error is present in data and parity data is detected by the syndrome information SYD_0, that an uncorrectable error is present in data or parity data is detected by the data error information DT_ERR-2, and that an error is present from the parity matrix PR is detected by the parity error information PRT_ERR, the decoding status flag DSF may indicate "0" (i.e., NE or CE). In this case, an error included in the parity data PRT may be a 1-bit error. In the case where the number of bits of an error included in the parity data PRT exceeds "1" or the error exceeds the error correction capability of the ECC engine, the decoding status flag DSF may be determined to be "1" (i.e., UE).

Figure 17:
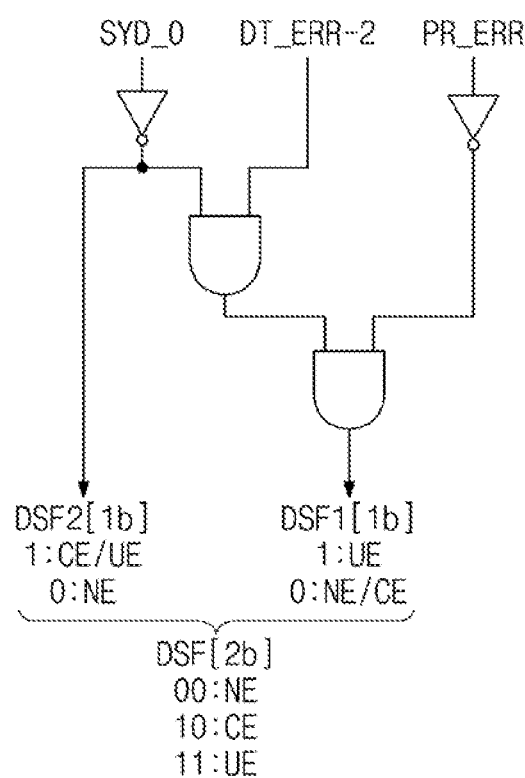
FIG. 17 is a diagram illustrating an example of a DSF detecting circuit using data error information from a fast data error checking circuit of FIG. 15.

FIG. 17 is a diagram illustrating an example of a DSF detecting circuit using data error information from a fast data error checking circuit of FIG. 15.

Referring to FIGS. 15 and 17, a DSF detecting circuit 115d-3 may generate the first decoding status flag DSF1 through an operation (i.e., /SYD_0*DT_ERR-2)*/PRT_ERR) similar to that described with reference to FIG. 16. The DSF detecting circuit 115d-3 may invert the syndrome information SYD_0 to generate the second decoding status flag DSF2. The DSF detecting circuit 115d-3 may combine the first and second decoding status flags DSF1 and DSF2 to generate the decoding status flag DSF of 2b. The meanings of the first decoding status flag DSF1 of 1b, the second decoding status flag DSF2 of 1b, and each value of the decoding status flag DSF of 2b are similar to those described with reference to FIG. 13, and thus, additional description will be omitted to avoid redundancy.

As described above, the ECC decoder according to the present example embodiment may generate the decoding status flag DSF based on information that is not included in some columns of the H-matrix. The fast data error checking circuit 115e-2 described with reference to FIGS. 14 and 15 may determine whether an error is present in the read data RDT, by comparing some bits of the syndrome SYD with each column of the simplified H-matrix sim-H-mat_UE for UE determination. In this case, because each column of the simplified H-matrix sim-H-mat_UE for UE determination is based on information not included in the H-matrix H-mat, that some bits of the syndrome SYD coincide with any one of the columns of the simplified H-matrix sim-H-mat_UE for UE determination (i.e., that the data error information DT_ERR-2 has a value of "1") may mean that an uncorrectable error is included in the read data RDT (i.e., that the decoding status is the "UE"), and that some bits of the syndrome SYD are different from all the columns of the simplified H-matrix sim-H-mat_UE for UE determination (i.e., that the data error information DT_ERR-2 has a value of "0") may mean that an error is not included in the read data RDT or a correctable error is included therein (i.e., that the decoding status is the "NE" or "CE"). That is, the data error information DT_ERR-2 generated by the fast data error checking circuit 115e-2 described with reference to FIGS. 14 and 15 may be used as the decoding status flag DSF without passing through the DSF detecting circuits 115d-2 or 115d-3 described with reference to FIG. 16 or 17.

The configuration of the above ECC decoder may be implemented based on a specific H-matrix. Accordingly, the configuration of the ECC decoder (in particular, the decoding status flag generator) according to the present disclosure may be variously changed or modified depending on a structure and a characteristic of the H-matrix.

Figure 18:
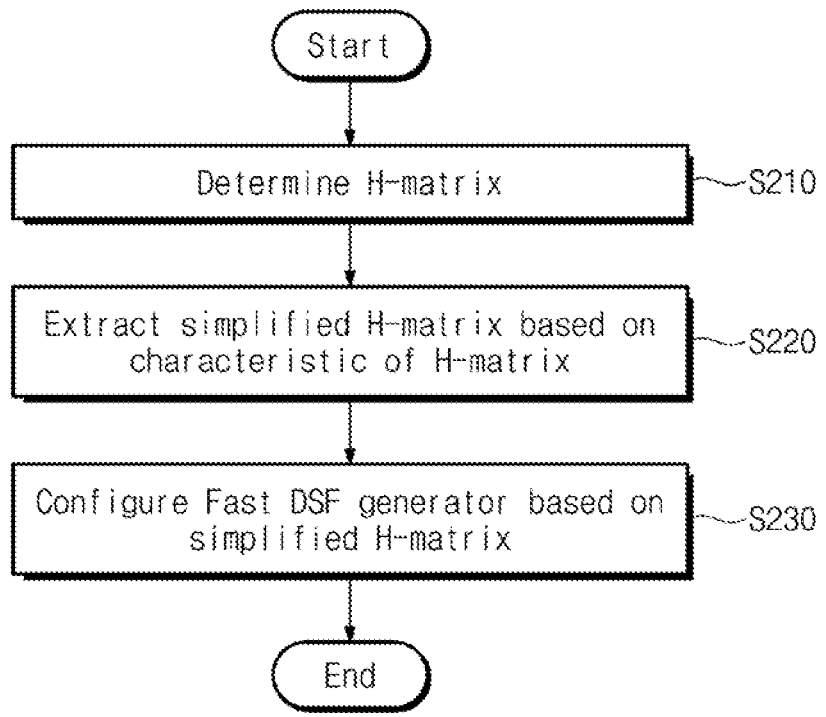
FIG. 18 is a flowchart for describing a method of generating a simplified H-matrix according to an example embodiment.

FIG. 18 is a flowchart for describing a method of generating a simplified H-matrix according to an example embodiment.

The flowchart of FIG. 18 may be performed by the design tool for an ECC circuit in the process of manufacturing the memory device 100.

Referring to FIG. 18, in operation S210, the H-matrix may be determined. For example, the H-matrix that is used in the ECC circuit 110 (in particular, the ECC decoder) may be determined depending on the reliability or performance of the memory device 100. The H-matrix may be determined in various manners in consideration of various factors such as a way to implement the ECC circuit 110, an error correction algorithm, or an error correction capability.

In operation S220, the simplified H-matrix sim-H-mat may be extracted based on a characteristic or partial information of the H-matrix. For example, it is assumed that the H-matrix is the H-matrix H-mat described with reference to FIGS. 6, 7A, 7B, and 7C. In this case, in the H-matrix, the first sub-rows (i.e., rows corresponding to S0 to S2) are implemented with the same sub-matrices repeated in units of 8 columns, and second sub-rows (i.e., rows corresponding to S3 to S7) are implemented with a plurality of sub-matrices each including the same columns. In this case, whether the syndrome SYD is matched with at least one of the columns of the H-matrix H-mat (i.e., whether an error is present in the read data RDT or the parity data PRT) may be determined by comparing only partial information (i.e., rows corresponding to the second sub-rows S3 to S7) with some bits S3 to S7 of the syndrome SYD instead of comparing the syndrome SYD with all the columns of the H-matrix H-mat. That is, whether an error is present in the read data RDT or the parity data PRT may be determined by comparing some bits of the syndrome SYD with only partial information of the H-matrix H-mat.

The above characteristic of the H-matrix H-mat may vary depending on an implementation of the H-matrix H-mat, and the H-matrix H-mat may not be divided by a specific row unit or a specific column unit. For example, in the simplified H-matrix sim-H-mat generated based on a part of the H-matrix H-mat, values corresponding to S0, S1, S2, S3, and S4 of the syndrome SYD may be compared with respect to the 0-th column thereof, and values corresponding to S0, S2, S4, S6, and S7 of the syndrome SYD may be compared with respect to the first column. In an example embodiment, in the case where a size of the read data RDT is 128b, the H-matrix may be of dimension 8×128+8×8 (parity matrix). In this case, in the case where the H-matrix is divided in units having 8b, the simplified H-matrix sim-H-mat may be of dimension $(8-\log_2 8) \times (128/8)$. In another implementation, in the case where the H-matrix is divided in units having 16b (or 16 bits), the simplified H-matrix sim-H-mat may be of dimension $(8-\log_2 16) \times (128/16)$.

The simplified H-matrix sim-H-mat may be generated based on partial information included in the H-matrix. In another implementation, the simplified H-matrix sim-H-mat may be generated based on information different from the partial information included in the H-matrix (i.e., partial information not included in the H-matrix). In this case, the simplified H-matrix sim-H-mat may be extracted or generated as described with reference to FIGS. 14 and 15, and whether the decoding status is the "UE" may be determined through the simplified H-matrix sim-H-mat.

The simplified H-matrix sim-H-mat may be generated by performing various logical operations (i.e., OR, AND, and XOR operations) on specific columns of the H-matrix.

In operation S230, the fast DSF generator may be configured based on the simplified H-matrix sim-H-mat. For example, as described with reference to FIGS. 1 to 17, the fast data error checking circuit may be implemented based on the simplified H-matrix sim-H-mat, and the fast DSF generator may generate the decoding status flag DSF based on an output of the fast data error checking circuit (i.e., data error information), an output of a syndrome checking circuit (i.e., syndrome information), and an output of a parity error checking circuit (i.e., parity error information).

In example embodiments, it will be understood that the H-matrix may be variously changed or modified depending on an implementation of the ECC circuit or the performance of the ECC circuit, and a way to implement the simplified H-matrix may also be variously changed or modified depending on the modification of the H-matrix.

Figure 19:
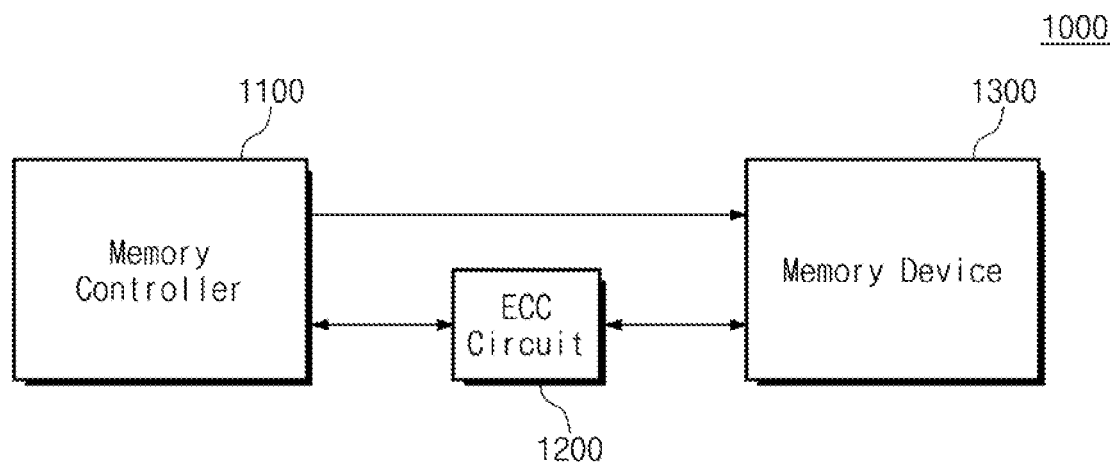
FIG. 19 is a block diagram illustrating a memory system according to an example embodiment.

FIG. 19 is a block diagram illustrating a memory system according to an example embodiment.

Referring to FIG. 19, a memory system 1000 may include a memory controller 1100, an ECC circuit 1200, and a memory device 1300.

The memory controller 1100 may store data in the memory device 1300 or may read data stored in the memory device 1300.

The ECC circuit 1200 may be placed on a data path between the memory controller 1100 and the memory device 1300. The ECC circuit 1200 may be configured to correct an error of data that are exchanged between the memory controller 1100 and the memory device 1300. The ECC circuit 1200 may generate the decoding status flag DSF based on the operation method described with reference to FIGS. 1 to 18.

Figure 20:
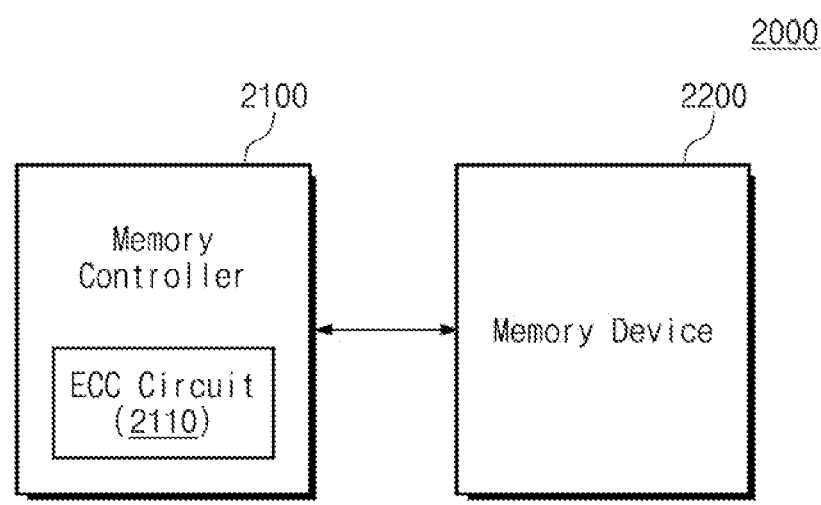
FIG. 20 is a block diagram illustrating a memory system according to an example embodiment.

FIG. 20 is a block diagram illustrating a memory system according to an example embodiment.

Referring to FIG. 20, a memory system 2000 may include a memory controller 2100 and a memory device 2200.

The memory controller 2100 may include an ECC circuit 2110. The ECC circuit 2110 may be configured to generate parity data for data to be stored in the memory device 2200 or to correct an error of data read from the memory device 2200 based on the read data and parity data read from the memory device 2200. The ECC circuit 2110 may generate the decoding status flag DSF based on the method described with reference to FIGS. 1 to 18.

Figure 21:
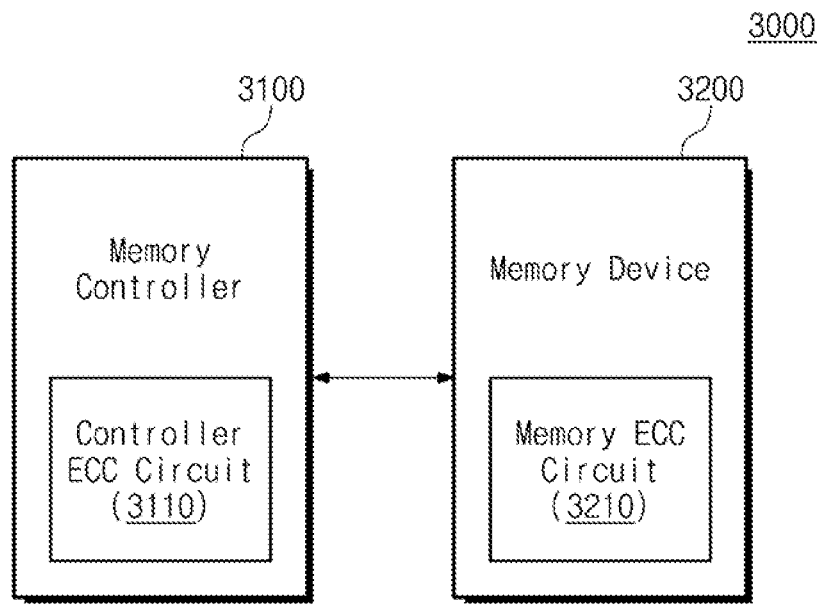
FIG. 21 is a block diagram illustrating a memory system according to an example embodiment.

FIG. 21 is a block diagram illustrating a memory system according to an example embodiment.

Referring to FIG. 21, a memory system 3000 may include a memory controller 3100 and a memory device 3200.

The memory controller 3100 may include a controller ECC circuit 3110. The controller ECC circuit 3110 may generate first parity for write data to be stored in the memory device 3200 and may correct an error of read data based on the read data and the first parity received from the memory device 3200.

The memory device 3200 may include a memory ECC circuit 3210. The memory ECC circuit 3210 may generate second parity for write data and the first parity received from the memory controller 3100, and may correct an error of read data and the first parity based on the read data, the first parity, and the second parity read from the memory device 3200.

In an example embodiment, each of the controller ECC circuit 3110 and the memory ECC circuit 3210 may generate the decoding status flag DSF based on the method described with reference to FIGS. 1 to 18.

In the example embodiments described with reference to FIGS. 1 to 18, the description is given as the ECC circuit 110 is an on-die ECC (OD-ECC) circuit included in the memory device 100, but, referring to FIGS. 19 to 21, an ECC circuit may be inside or outside a memory device or may be placed within a memory controller.

Figure 22:
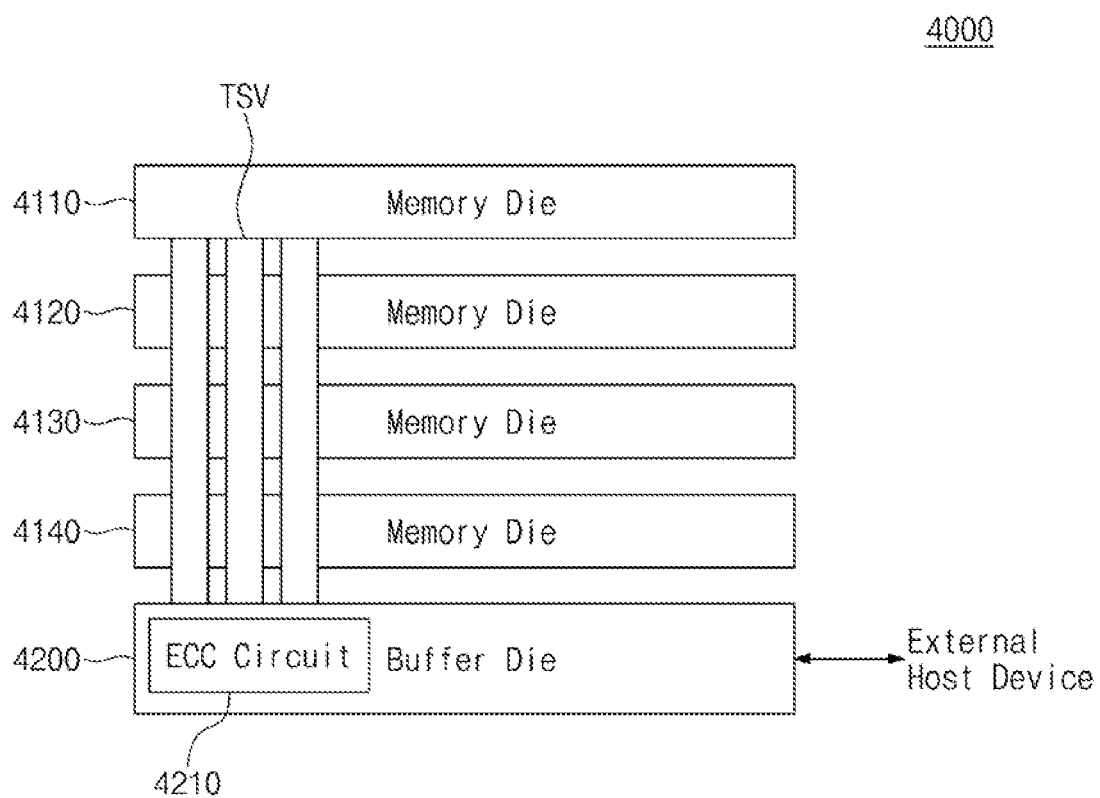
FIG. 22 is a diagram illustrating an example of a memory package according to an example embodiment.

FIG. 22 is a diagram illustrating an example of a memory package according to an example embodiment.

Referring to FIG. 22, a memory package 4000 may include a plurality of memory dies 4110 to 4140 and a buffer die 4200. Each of the plurality of memory dies 4110 to 4140 may be a DRAM device. The plurality of memory dies 4110 to 4140 and the buffer die 4200 may be implemented in a stacked structure, may be electrically connected with each other through TSV (through silicon via), and may communicate with each other.

The memory package 4000 may be provided as one semiconductor package through packaging by the following: package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), small outline (SOIC), shrink small outline package (SSOP), thin small outline (TSOP), thin quad flatpack (TQFP), system in package (SIP), multi-chip package (MCP), wafer-level fabricated package (WFP), or wafer-level processed stack package (WSP).

The buffer die 4200 may communicate with an external host device (or a memory controller). The buffer die 4200 may be configured to temporarily store data to be written in the plurality of memory dies 4110 to 4140 or to temporarily store data read from the plurality of memory dies 4110 to 4140. The buffer die 4200 may include an ECC circuit 4210. The ECC circuit 4210 may generate parity for data to be stored in the memory dies 4110 to 4140 or may correct an error of data read from the memory dies 4110 to 4140. The ECC circuit 4210 may be implemented based on the method described with reference to FIGS. 1 to 18 or may generate the decoding status flag DSF.

Figure 23:
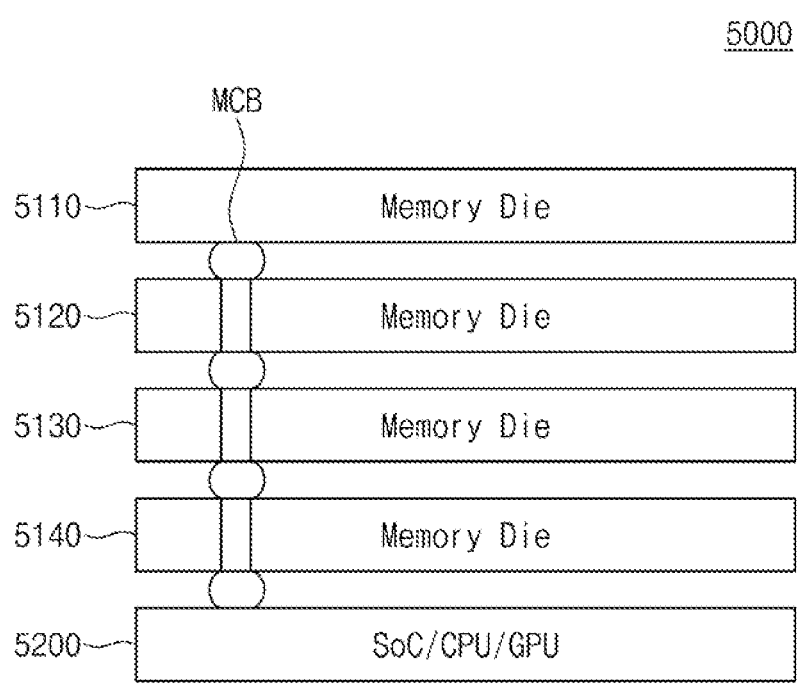
FIG. 23 is a diagram illustrating an example of a memory package according to an example embodiment.

FIG. 23 is a diagram illustrating an example of a memory package according to an example embodiment.

Referring to FIG. 23, a memory package 5000 may include a plurality of memory dies 5110 to 5140 and a host die 5200. The plurality of memory dies 5110 to 5140 may be electrically connected with each other through micro bumps MCB, may have a stacked structure, and may be directly stacked on the host die 5200. The host die 5200 may be a SoC, a CPU, or a GPU. In an example embodiment, each of the plurality of memory dies 5110 to 5140 or the host die 5200 may include the ECC circuit described with reference to FIGS. 1 to 18.

Figure 24:
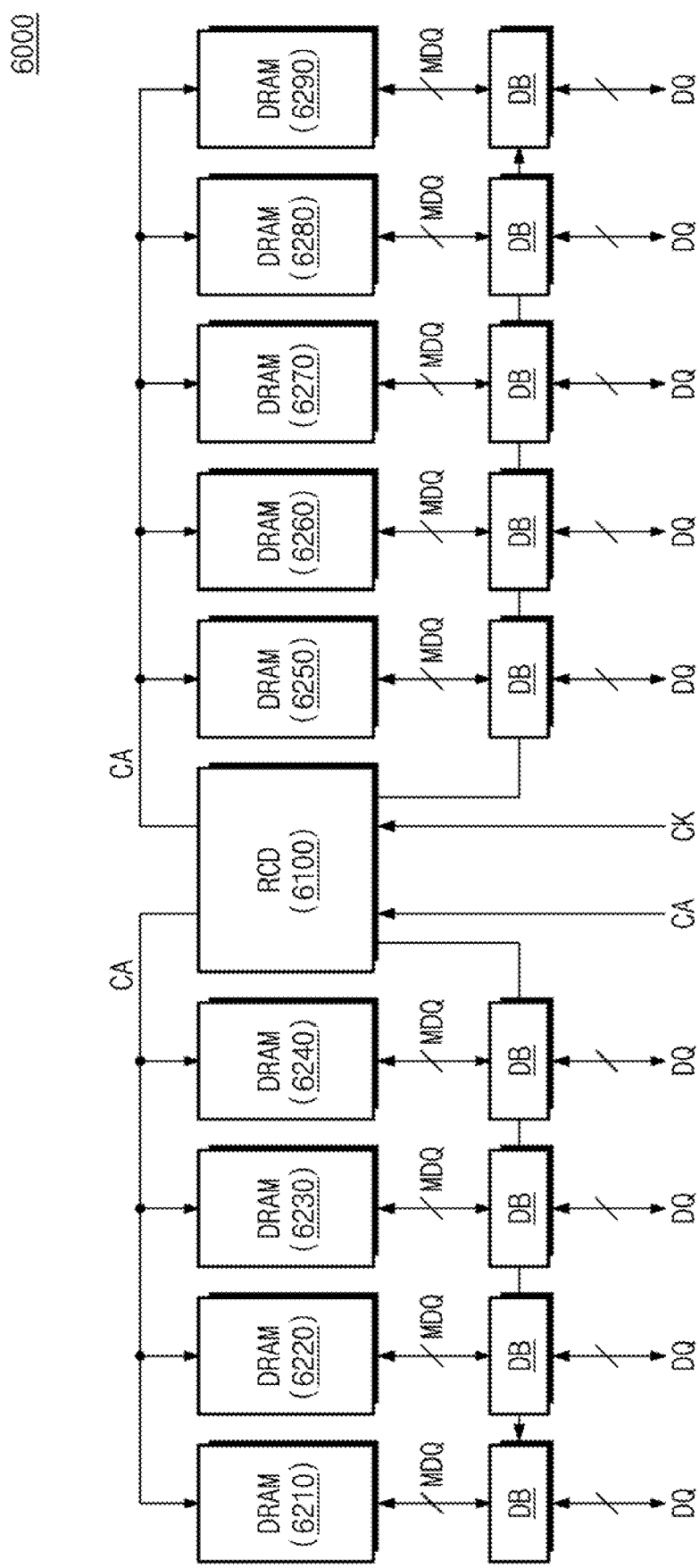
FIG. 24 is a block diagram illustrating a memory module to which a memory device according to the present disclosure is applied.

FIG. 24 is a block diagram illustrating a memory module 6000 to which a memory device according to the present disclosure is applied.

Referring to FIG. 24, the memory module 6000 may include a register clock driver (RCD) 6100, a plurality of memory devices 6210 to 6290, and a plurality of data buffers DB.

The RCD 6100 may receive the command/address CA and the clock signal CK from an external device (e.g., a host or a memory controller). In response to the received signals, the RCD 6100 may send the command/address CA to the plurality of memory devices 6210 to 6290 and may control the plurality of data buffers DB.

The plurality of memory devices 6210 to 6290 may be respectively connected with the plurality of data buffers DB through data lines MDQ.

In an example embodiment, each of the plurality of memory devices 6210 to 6290 may include the ECC circuit described with reference to FIGS. 1 to 18, and may generate the decoding status flag DSF based on the method described with reference to FIGS. 1 to 18. The plurality of data buffers DB may send and receive data to and from an external device (e.g., a host or a memory controller) through a plurality of data lines DQ.

The memory module 6000 illustrated in FIG. 24 may have the form factor of a load-reduced dual in-line memory module (LRDIMM) or, e.g., the memory module 6000 may have the form factor of a registered DIMM (RDIMM) in which the plurality of data buffers DB are not included.

The memory module 6000 may further include an ECC circuit placed outside the plurality of memory devices 6210 to 6290, and may be configured to generate the decoding status flag DSF based on the method described with reference to FIGS. 1 to 18.

In an example embodiment, at least one of the plurality of memory devices 6210 to 6290 may be configured to store parity data. The parity data may be provided from the external device (e.g., a host or a memory controller); in this case, the external device may include the ECC circuit described with reference to FIGS. 1 to 18 or may generate the decoding status flag DSF based on the method described with reference to FIGS. 1 to 18.

Figure 25:
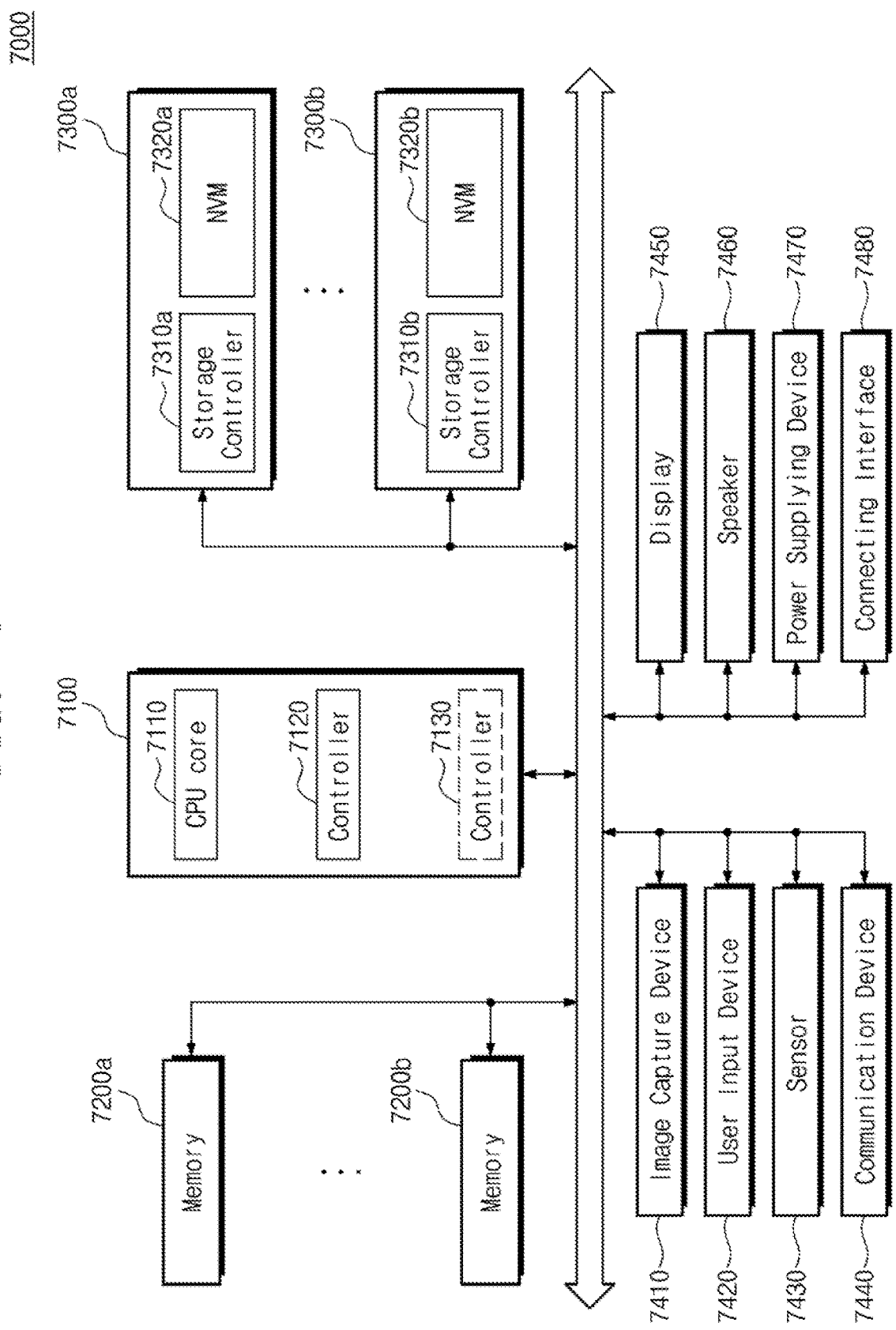
FIG. 25 is a diagram illustrating a system to which a storage device according to an example embodiment is applied.

FIG. 25 is a diagram of a system 7000 to which a storage device is applied, according to an example embodiment.

The system 7000 of FIG. 25 may be a mobile system (such as a portable communication terminal (e.g., a mobile phone), a smartphone, a tablet personal computer (PC), a wearable device, a healthcare device, or an Internet of things (IoT) device) or, e.g., a PC, a laptop computer, a server, a media player, or an automotive device (e.g., a navigation device).

Referring to FIG. 25, the system 7000 may include a main processor 7100, memories (e.g., 7200a and 7200b), and storage devices (e.g., 7300a and 7300b). In addition, the system 7000 may include at least one of an image capturing device 7410, a user input device 7420, a sensor 7430, a communication device 7440, a display 7450, a speaker 7460, a power supplying device 7470, and a connecting interface 7480.

The main processor 7100 may control all operations of the system 7000, more specifically, operations of other components included in the system 7000. The main processor 7100 may be implemented as a general-purpose processor, a dedicated processor, or an application processor.

The main processor 7100 may include at least one CPU core 7110 and further include a controller 7120 configured to control the memories 7200a and 7200b and/or the storage devices 7300a and 7300b. In some example embodiments, the main processor 7100 may further include an accelerator 7130, which is a dedicated circuit for a high-speed data operation, such as an artificial intelligence (AI) data operation. The accelerator 7130 may include a graphics processing unit (GPU), a neural processing unit (NPU) and/or a data processing unit (DPU) and be implemented as a chip that is physically separate from the other components of the main processor 7100.

The memories 7200a and 7200b may be used as main memory devices of the system 7000. Although each of the memories 7200a and 7200b may include a volatile memory, such as static random access memory (SRAM) and/or dynamic RAM (DRAM), each of the memories 7200a and 7200b may include non-volatile memory, such as a flash memory, phase-change RAM (PRAM) and/or resistive RAM (RRAM). The memories 7200a and 7200b may be implemented in the same package as the main processor 7100.

The memories 7200a and 7200b may be the memory device including the ECC circuit described with reference to FIGS. 1 to 18, and generate the decoding status flag (DSF) based on the method described with reference to FIGS. 1 to 18.

The storage devices 7300a and 7300b may serve as non-volatile storage devices configured to store data regardless of whether power is supplied thereto, and have larger storage capacity than the memories 7200a and 7200b. The storage devices 7300a and 7300b may respectively include storage controllers (STRG CTRL) 7310a and 7310b and NVM (Non-Volatile Memory)s 7320a and 7320b configured to store data via the control of the storage controllers 7310a and 7310b. Although the NVMs 7320a and 7320b may include flash memories having a two-dimensional (2D) structure or a three-dimensional (3D) V-NAND structure, the NVMs 7320a and 7320b may include other types of NVMs, such as PRAM and/or RRAM.

The storage devices 7300a and 7300b may be physically separated from the main processor 7100 and included in the system 7000 or implemented in the same package as the main processor 7100. In addition, the storage devices 7300a and 7300b may have types of solid-state devices (SSDs) or memory cards and be removably combined with other components of the system 700 through an interface, such as the connecting interface 7480 that will be described below. The storage devices 7300a and 7300b may be devices to which a standard protocol, such as a universal flash storage (UFS), an embedded multi-media card (eMMC), or a non-volatile memory express (NVMe), is applied.

The image capturing device 7410 may capture still images or moving images. The image capturing device 7410 may include a camera, a camcorder, and/or a webcam.

The user input device 7420 may receive various types of data input by a user of the system 7000 and include a touch pad, a keypad, a keyboard, a mouse, and/or a microphone.

The sensor 7430 may detect various types of physical quantities, which may be obtained from the outside of the system 7000, and convert the detected physical quantities into electric signals. The sensor 7430 may include a temperature sensor, a pressure sensor, an illuminance sensor, a position sensor, an acceleration sensor, a biosensor, and/or a gyroscope sensor.

The communication device 7440 may transmit and receive signals between other devices outside the system 7000 according to various communication protocols. The communication device 7440 may include an antenna, a transceiver, and/or a modem.

The display 7450 and the speaker 7460 may serve as output devices configured to respectively output visual information and auditory information to the user of the system 7000.

The power supplying device 7470 may appropriately convert power supplied from a battery (not shown) embedded in the system 7000 and/or an external power source, and supply the converted power to each of components of the system 7000.

The connecting interface 7480 may provide connection between the system 7000 and an external device, which is connected to the system 7000 and capable of transmitting and receiving data to and from the system 7000. The connecting interface 7480 may be implemented using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

By way of summation and review, a DRAM may be used as a system memory of a mobile device or a computer device. The DRAM device may include an error correction code (ECC) circuit for improving the reliability of data stored therein. The ECC circuit may correct an error of data stored in the DRAM device. When the error of data exceeds an error correction capability of the ECC circuit, the error is incapable of being normally corrected. In this case, a means for notifying a decoding result of the ECC circuit to an external device (e.g., a memory controller) is required. Thus, the ECC circuit may provide the memory controller with a decoding status flag DSF including information about the ECC decoding result. According to an example embodiment, the ECC circuit may generate the decoding status flag DSF using only a syndrome that is generated in the ECC decoding process. In this case, a time taken to generate the decoding status flag DSF may be shortened.

As described above, example embodiments may provide a memory device with improved reliability and improved performance and an error correction code decoding method of the memory device.

According to an example embodiment, an ECC circuit included in a memory device may generate a decoding status flag using only syndrome information. In this case, because the decoding status flag is generated together with a syndrome decoding operation, the whole latency of ECC decoding may be decreased. Accordingly, a memory device with improved performance and improved reliability and an error correction code decoding method of the memory device are provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A memory device, comprising:
a memory cell array configured to store first data and first parity data;
an error correction code (ECC) circuit configured to perform ECC decoding based on the first data and the first parity data, and to output error-corrected data and a decoding status flag; and
an input/output circuit configured to provide the error-corrected data and the decoding status flag to a memory controller,
wherein the ECC circuit includes:
a syndrome generator configured to generate bits of a syndrome based on the first data and the first parity data;
a syndrome decoding circuit configured to decode the bits of the syndrome to generate an error vector;
a correction logic circuit configured to generate the error-corrected data based on the error vector and the first data; and a fast decoding status flag (DSF) generator configured to generate the decoding status flag based on the bits of the syndrome, without the error vector,
wherein the error vector includes information about a bit position of the first data at which an error occurs, and
wherein the decoding status flag indicates whether at least one of a correctable error, an uncorrectable error, and a non-error is included in the first data.

2. The memory device as claimed in claim 1, wherein the syndrome decoding circuit and the fast decoding status flag generator operate in parallel.

3. The memory device as claimed in claim 1, wherein the syndrome decoding circuit generates the error vector by comparing the bits of the syndrome with bits of each column of a parity-check matrix, and
wherein a value of each bit of the parity-check matrix is predetermined.

4. The memory device as claimed in claim 3, wherein the fast decoding status flag generator includes:
a syndrome checking circuit configured to determine whether the bits of the syndrome are all-zero and to output syndrome information;
a parity error checking circuit configured to determine whether an error is present in the first parity data, by comparing the bits of the syndrome with bits of each column of a parity matrix, and to output parity error information;
a fast data error checking circuit configured to determine whether an error is present in the first data or the first parity data, by comparing a part of the bits of the syndrome with bits of each column of a simplified-parity-check matrix, and to output data error information; and
a decoding status flag detecting circuit configured to output the decoding status flag based on the syndrome information, the parity error information, and the data error information,
wherein the parity matrix is a part of the parity-check matrix,
wherein the simplified-parity-check matrix is generated from the parity-check matrix, and
wherein each row of the parity matrix and each row of the parity-check matrix correspond to each of the bits of the syndrome.

5. The memory device as claimed in claim 4, wherein, when the syndrome information indicates that the bits of the syndrome are not all-zero, the parity error information indicates that an error is absent from the first parity data, and the data error information indicates that an error is absent from the first data or the first parity data, the decoding status flag indicates that the uncorrectable error is present in the first data.

6. The memory device as claimed in claim 4, wherein, when the syndrome information indicates that the bits of the syndrome are not all-zero, the parity error information indicates that an error is absent from the first parity data, and the data error information indicates that an error is absent from the first data or the first parity data, the decoding status flag indicates that the uncorrectable error is present in the first data,
wherein, when the syndrome information indicates that the bits of the syndrome are not all-zero, the parity error information does not indicate that an error is absent from the first parity data, or the data error information does not indicate that an error is absent from the first data or the first parity data, the decoding status flag indicates that the correctable error is present in the first data, and wherein, when the syndrome information does not indicate that the bits of the syndrome are not all-zero, the parity error information does not indicate that an error is absent from the first parity data, or the data error information does not indicate that an error is absent from the first data or the first parity data, the decoding status flag indicates that the non-error is included in the first data.

7. The memory device as claimed in claim 4, wherein the parity matrix is an n×n identity matrix, wherein the "n" is the number of bits included in the syndrome, and wherein the simplified-parity-check matrix includes only information of some rows of the parity-check matrix used by the syndrome decoding circuit.

8. The memory device as claimed in claim 7, wherein the first data are 128 bits, the first parity data are 8 bits, the syndrome is 8 bits, the parity-check matrix is of dimension 8×128, and the simplified-parity-check matrix is of dimension (8-$\log_2$ m)× (128×m), wherein the "m" is an integer greater than 1.

9. The memory device as claimed in claim 4, wherein the parity matrix is an n×n identity matrix, wherein the "n" is the number of bits included in the syndrome, and wherein the simplified-parity-check matrix includes only information not included in some rows of the parity-check matrix used by the syndrome decoding circuit.

10. The memory device as claimed in claim 9, wherein, when the syndrome information indicates that the bits of the syndrome are not all-zero, the parity error information indicates that the bits of the syndrome is different from bits of all columns of the parity matrix, and the data error information indicates that a part of the bits of the syndrome corresponds to bits of at least one column of the simplified-parity-check matrix, the decoding status flag indicates that the uncorrectable error is present in the first data, wherein, when the syndrome information indicates that the bits of the syndrome are not all-zero, the parity error information indicates that the bits of the syndrome correspond to bits of at least one of the columns of the parity matrix, and the data error information indicates that a part of the bits of the syndrome corresponds to bits of at least one column of the simplified-parity-check matrix, the decoding status flag indicates that the correctable error is present in the first data or that the non-error is included in the first data.

11. The memory device as claimed in claim 1, wherein the ECC circuit further includes an ECC encoder configured to generate the first parity data for the first data based on a basis bit.

12. The memory device as claimed in claim 1, further comprising:

a command/address buffer configured to receive and buffer command/address signals (CA) from the memory controller;

an address decoder configured to receive an address signal from the command/address buffer, and to decode the address signal;

a command decoder configured to receive a command signal from the command/address buffer and to decode the command signal;

a row decoder configured to control a plurality of word lines connected with the memory cell array depending on a result of the address decoding of the address decoder;

a columns decoder configured to control a plurality of bit lines connected with the memory cell array depending on a result of the address decoding of the address decoder; and a sense amplifier and write driver configured to store the first data and the first parity data in the memory cell array or to read the first data and the first parity data stored in the memory cell array, under control of the command decoder.

13. An error correction code (ECC) circuit configured to correct first data based on the first data and first parity data stored in a memory device, comprising:

a syndrome generator configured to generate bits of a syndrome based on the first data and the first parity data from the memory device;

a syndrome decoding circuit configured to compare the bits of the syndrome and bits of each column of a parity-check matrix to generate an error vector;

a correction logic circuit configured to generate error-corrected data based on the error vector and the first data; and a fast decoding status flag (DSF) generator configured to generate a decoding status flag indicating a decoding status for the error-corrected data based on the bits of the syndrome and bits of a simplified-parity-check matrix, wherein the bits of the simplified-parity-check matrix are generated from bits of the parity-check matrix, and includes only information about a part of the bits of the parity-check matrix, wherein the error vector includes information about a bit position of the first data at which an error occurs, wherein a value of each bit of the parity-check matrix is predetermined, and wherein the decoding status flag indicates whether at least one of a correctable error, an uncorrectable error and a non-error is included in the first data.

14. The ECC circuit as claimed in claim 13, wherein the fast decoding status flag generator operates in parallel with the syndrome decoding circuit.

15. The ECC circuit as claimed in claim 13, wherein the parity-check matrix includes "a" rows and "b" columns, wherein each of the "a" and the "b" is a natural number, wherein the simplified-parity-check matrix includes "c" rows and "d" columns, wherein the "c" is a natural number smaller than the "a", and the "d" is a natural number smaller than the "b", wherein the "c" rows of the simplified-parity-check matrix include information about first sub-rows of the "a" rows of the parity-check matrix, and wherein the number of the first sub-rows is the "c".

16. The ECC circuit as claimed in claim 13, wherein the fast decoding status flag generator includes:

a syndrome checking circuit configured to determine whether the bits of the syndrome are all-zero and to output syndrome information;

a parity error checking circuit configured to determine whether an error is present in the first parity data, by comparing the bits of the syndrome with bits of each column of a parity matrix, and to output parity error information;

a fast data error checking circuit configured to determine whether an error is present in the first data or the first parity data, by comparing a part of the bits of the syndrome with bits of each column of the simplified-parity-check matrix, and to output data error information; and a decoding status flag detecting circuit configured to output the decoding status flag based on the syndrome information, the parity error information, and the data error information,
wherein the parity matrix is a part of the parity-check matrix.

17. The ECC circuit as claimed in claim 13, further comprising an ECC encoder configured to generate the first parity data for the first data based on a basis bit, before the first data are stored in the memory device.

18. The ECC circuit as claimed in claim 13, wherein the ECC circuit is an on-die ECC (OD-ECC) circuit included in the memory device.

19. An operation method of an error correction code (ECC) circuit configured to correct first data based on the first data and first parity data stored in a memory device, the method comprising:
   generating bits of a syndrome based on the first data and the first parity data;
   generating an error vector based on the bits of the syndrome and bits of a parity-check matrix;
   performing a logical operation on the error vector and the first data to generate error-corrected data;
   generating a decoding status flag based on the bits of the syndrome and bits of a simplified-parity-check matrix generated based on the bits of the parity-check matrix; and
   sending the error-corrected data and the decoding status flag to a memory controller,
   wherein the generating of the error vector and the generating of the decoding status flag are performed in parallel,
   wherein the error vector includes information about a bit position of the first data at which an error occurs,
   wherein a value of each bit of the parity-check matrix is predetermined, and
   wherein the decoding status flag indicates whether at least one of a correctable error, an uncorrectable error, and a non-error is included in the first data.

20. The method as claimed in claim 19, wherein the generating of the decoding status flag based on the bits of the syndrome and the bits of the simplified-parity-check matrix includes:
   determining whether the bits of the syndrome are all-zero, to generate syndrome information;
   comparing the bits of the syndrome with bits of each column of a parity matrix to generate parity error information including information about an error of the first parity data;
   comparing a part of the bits of the syndrome with bits of each column of the simplified-parity-check matrix to generate data error information including information about an error of the first data or an error of the first parity data; and
   generating the decoding status flag based on the syndrome information, the parity error information, and the data error information,
   wherein, when the syndrome information indicates that the bits of the syndrome are not all-zero, the parity error information indicates that an error is absent from the first parity data, and the data error information indicates that an error is absent from the first data or the first parity data, the decoding status flag indicates that the uncorrectable error is present in the first data, and
   wherein the parity matrix is a part of the parity-check matrix.

\* \* \* \* \*